United States Patent
Mai et al.

(10) Patent No.: US 11,417,512 B2
(45) Date of Patent: Aug. 16, 2022

(54) METHOD FOR CLEANING SEMICONDUCTOR WAFER BACKSIDE SURFACE BY HYBRID BRUSH ASSEMBLY

(71) Applicant: TAIWAN SEMICONDUCTOR MANUFACTURING CO., LTD., Hsinchu (TW)

(72) Inventors: Hsuan-Ying Mai, Taoyuan (TW); Hui-Chun Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 16/786,033

(22) Filed: Feb. 10, 2020

(65) Prior Publication Data

US 2021/0249253 A1 Aug. 12, 2021

(51) Int. Cl.
| | |
|---|---|
| *H01L 21/67* | (2006.01) |
| *H01L 21/02* | (2006.01) |
| *G03F 7/20* | (2006.01) |
| *B08B 3/04* | (2006.01) |
| *B08B 1/00* | (2006.01) |

(52) U.S. Cl.
CPC .......... *H01L 21/0209* (2013.01); *B08B 1/002* (2013.01); *B08B 3/04* (2013.01); *G03F 7/70908* (2013.01); *H01L 21/02096* (2013.01); *H01L 21/67046* (2013.01)

(58) Field of Classification Search
None
See application file for complete search history.

(56) References Cited

U.S. PATENT DOCUMENTS

| | | | | |
|---|---|---|---|---|
| 7,077,731 | B1* | 7/2006 | Zhang | B08B 1/04 |
| | | | | 451/194 |
| 2002/0058332 | A1* | 5/2002 | Quake | B01L 3/502715 |
| | | | | 435/288.5 |
| 2013/0206171 | A1* | 8/2013 | Kurusu | H01L 21/67046 |
| | | | | 134/6 |
| 2015/0133032 | A1* | 5/2015 | Kubo | B24B 47/16 |
| | | | | 451/5 |
| 2018/0071884 | A1* | 3/2018 | Murachi | B08B 3/022 |
| 2019/0181022 | A1* | 6/2019 | Mouri | B08B 1/04 |

* cited by examiner

*Primary Examiner* — Mikhail Kornakov
*Assistant Examiner* — Ryan L Coleman
(74) *Attorney, Agent, or Firm* — Birch, Stewart, Kolasch & Birch, LLP

(57) ABSTRACT

In accordance with some embodiments, a wafer processing method is provided. The wafer processing method includes placing a semiconductor wafer on a wafer stage with a backside surface of the semiconductor wafer facing downwardly. The wafer processing method further includes positioning a first brush assembly below the backside surface of the semiconductor wafer. The wafer processing method also includes moving a first brush assembly toward the backside surface of the semiconductor wafer to a first position. At the first position, an inner brush member and an outer brush member of the first brush assembly, made of different materials, are in contact with the backside surface of the semiconductor wafer. In addition, the wafer processing method includes rotating the first brush assembly relative to the semiconductor wafer while the first brush assembly is in the first position.

20 Claims, 23 Drawing Sheets

S130

```
┌─────────────────────────────────────────────────────────────┐
│ Load a wafer on a wafer stage with a backside surface of    │──S131
│ the wafer facing downwards                                  │
└─────────────────────────────────────────────────────────────┘
                              │                                 ──S140
┌─────────────────────────────────────────────────────────────┐
│ Move a first brush assembly toward the backside surface to  │
│ enable an inner brush member and an outer brush member of   │──S141
│ the first brush assembly are in contact with the backside   │
└─────────────────────────────────────────────────────────────┘
                              │
┌─────────────────────────────────────────────────────────────┐
│ Supply a processing liquid over the first brush assembly    │──S142
└─────────────────────────────────────────────────────────────┘
                              │
┌─────────────────────────────────────────────────────────────┐
│ Rotate the first brush assembly relative to the             │──S143
│ semiconductor wafer for a first predetermined time          │
└─────────────────────────────────────────────────────────────┘
                              │
┌─────────────────────────────────────────────────────────────┐
│ Reciprocally move the first brush assembly back and forth   │──S144
│ along a traveling path that is parallel to the backside     │
│ surface                                                     │
└─────────────────────────────────────────────────────────────┘
                              │
┌─────────────────────────────────────────────────────────────┐
│ Move the first brush assembly away from the backside surface│──S145
└─────────────────────────────────────────────────────────────┘
                              │                                 ──S150
┌─────────────────────────────────────────────────────────────┐
│ Move a second brush assembly toward the backside surface    │──S151
└─────────────────────────────────────────────────────────────┘
                              │
┌─────────────────────────────────────────────────────────────┐
│ Rotate the second brush assembly relative to the            │──S152
│ semiconductor wafer for a second predetermined time         │
└─────────────────────────────────────────────────────────────┘
                              │
┌─────────────────────────────────────────────────────────────┐
│ Move the second brush assembly away from the backside surface│──S153
└─────────────────────────────────────────────────────────────┘
                              │
┌─────────────────────────────────────────────────────────────┐
│ Unload the wafer from wafer stage                           │──S132
└─────────────────────────────────────────────────────────────┘
```

Fig. 9

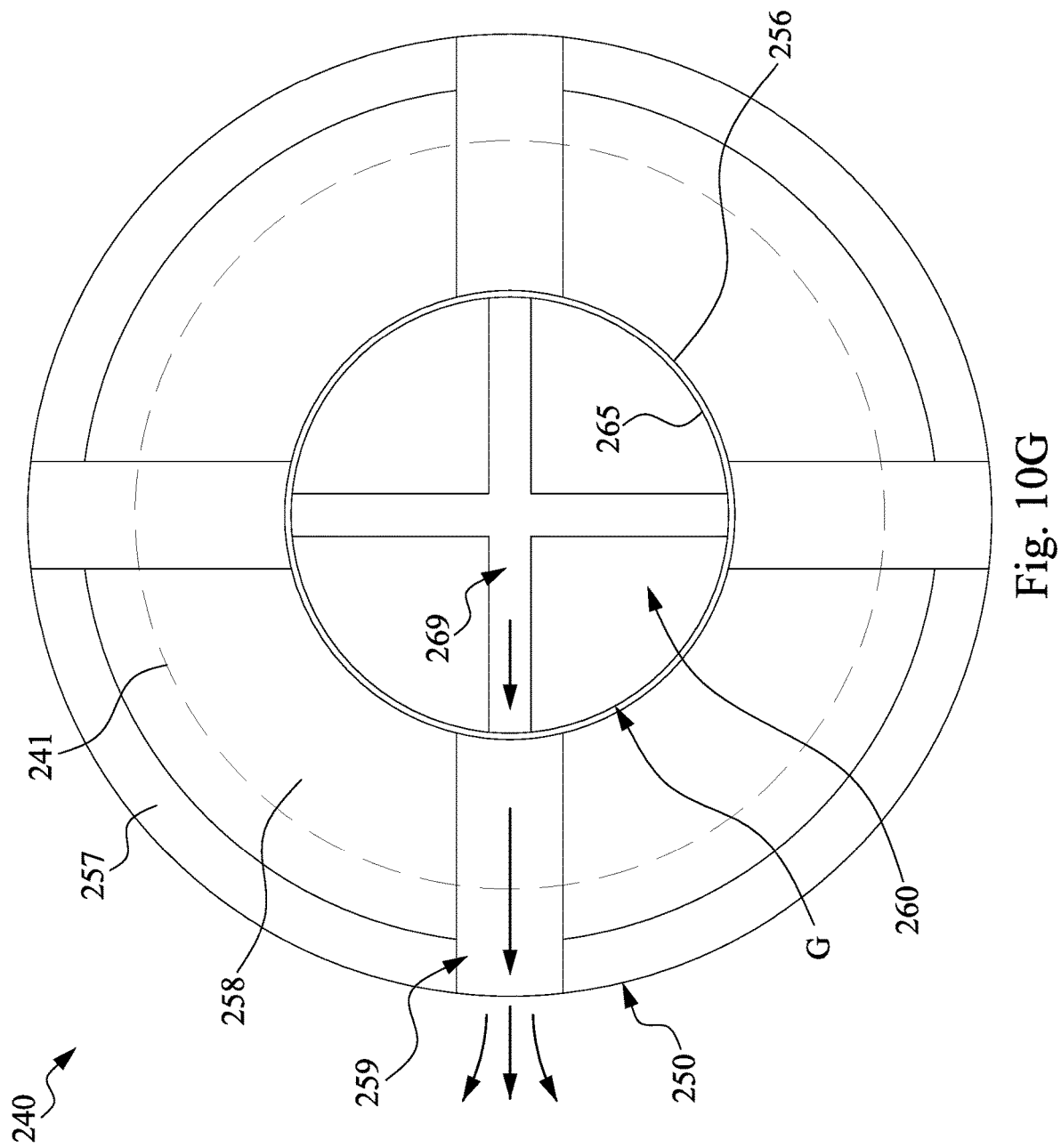

METHOD FOR CLEANING SEMICONDUCTOR WAFER BACKSIDE SURFACE BY HYBRID BRUSH ASSEMBLY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

IC design becomes more challenging as IC technologies continually progress towards smaller features. For example, an IC device includes a sequence of patterned layers and un-patterned layers that combine to form one or more IC features. Misalignment between the various layers can cause performance issues and even potentially cause an IC device to fail due to, for example, a short caused by misaligned layers. Overlay (generally referring to layer-to-layer positioning) of the various layers is thus a factor to ensuring the IC device and/or IC features function properly, and in particular, function according to design requirements for the IC device and/or IC feature.

Although existing semiconductor processing method have been generally adequate for their intended purposes, they have not been entirely satisfactory when it comes to advanced technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flow chart of a method of backside polishing process, in accordance with some embodiments of the present disclosure.

FIG. 10G is a schematic view of one stage of a method for a backside polishing process according to some embodiments of the present disclosure, wherein a first brush member is rotated to polish a semiconductor wafer.

DETAILED DESCRIPTION

Figure 1:
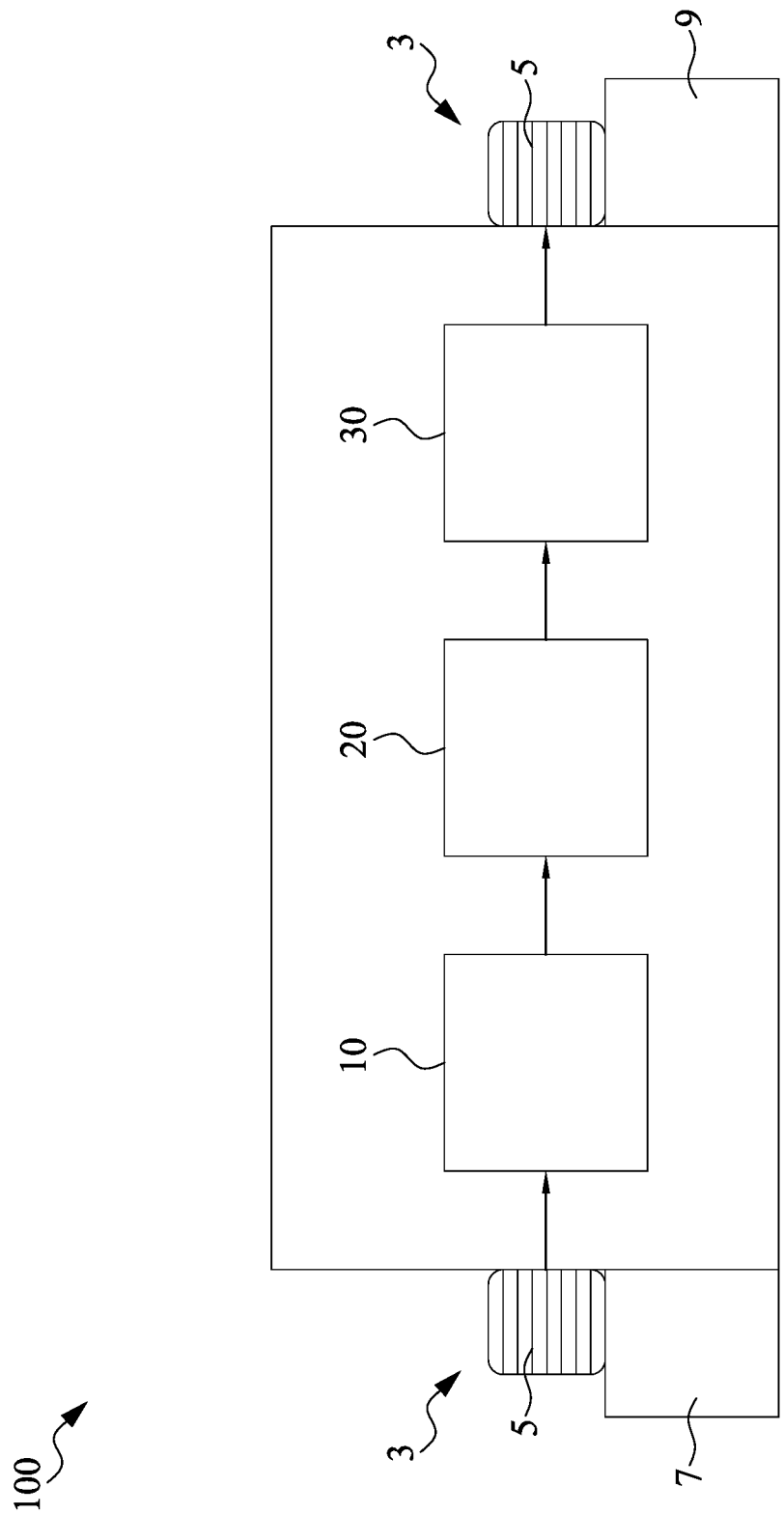
FIG. 1 is a schematic view of a semiconductor fabricating system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For semiconductor manufacturing, a lithography exposure process forms a patterned photoresist layer for various patterning processes, such as etching or ion implantation. In lithography exposure process, a photosensitive layer (resist) is applied to a surface of a semiconductor substrate, and an image of features defining parts of the semiconductor device is provided on the layer by exposing the layer to a pattern of high-brightness light. As semiconductor manufacturing evolve to provide for smaller critical dimensions and devices become smaller and increase in complexity, including the number of layers. Contaminants on a backside of a wafer may occur after the coating of photosensitive layer which will lead to a failure to focus the image on the surface of the wafer in the subsequent lithography exposure process, thereby causing the product to be scrapped. The embodiments in the disclosure provide a method and apparatus for polishing a wafer backside surface in order to improve the reliability of the lithography exposure process.

FIG. 1 is a schematic view of a semiconductor fabricating system 100, in accordance with some embodiments of the present disclosure. In some embodiments, the semiconductor fabricating system 100 is configured to process one or semiconductor wafers 5 and includes a photoresist coating module 10, a backside polishing module 20, an exposure module 30 and one or more load port, such as two load ports 7 and 9.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The load ports 7 and 9 are configured to enable a wafer carrier 3 containing one or more semiconductor wafers 5 to be placed at the semiconductor fabricating system 100. The load ports 7 and 9 are positioned adjacent to doors (not shown in figures) of the semiconductor fabricating system 100. When the wafer carrier 3 is located on the load ports 7 and 9, the semiconductor wafers 5 in the load ports 7 and 9 is transferred to/from the semiconductor fabricating system 100. In some embodiments, the wafer carrier 3 placed on the load port 7 contains the semiconductor wafers 5 to be processed, and the wafer carrier 3 placed on the load port 9 contains the semiconductor wafers 5 which have be processed by the semiconductor fabricating system 100. It will be appreciated that the numbers of the load ports can be added or deleted, and not to be limited by the embodiment shown in FIG. 1. In addition, the position of the load ports 7 and 9 can be modified, for example, the load ports 7 and 9 can be positioned adjacent to each other.

In some embodiments, after the semiconductor wafers 5 is loaded into the semiconductor fabricating system 100, the semiconductor wafers 5 are sequentially processed by the photoresist coating module 10, the backside polishing module 20 and the exposure module 30. In one exemplary embodiment, the semiconductor wafers 5 from the wafer carrier 3 that is placed on the load port 7 is coated with a photoresist layer in the photoresist coating module 10. Afterwards, a backside surface of each semiconductor wafers 5 is polished in the backside polishing module 20. Afterwards, the photoresist layer on each of the semiconductor wafers 5 is exposed by radiation such as DUV light or EUV light in the exposure module 30. Afterwards, the semiconductor wafers 5 are send to the wafer carrier 3 that is placed on the load port 9 from the exposure module 30. The movement of the semiconductor wafers 5 in the semiconductor fabricating system 100 may be performed by one or more robotic arms (not shown).

Figure 2:
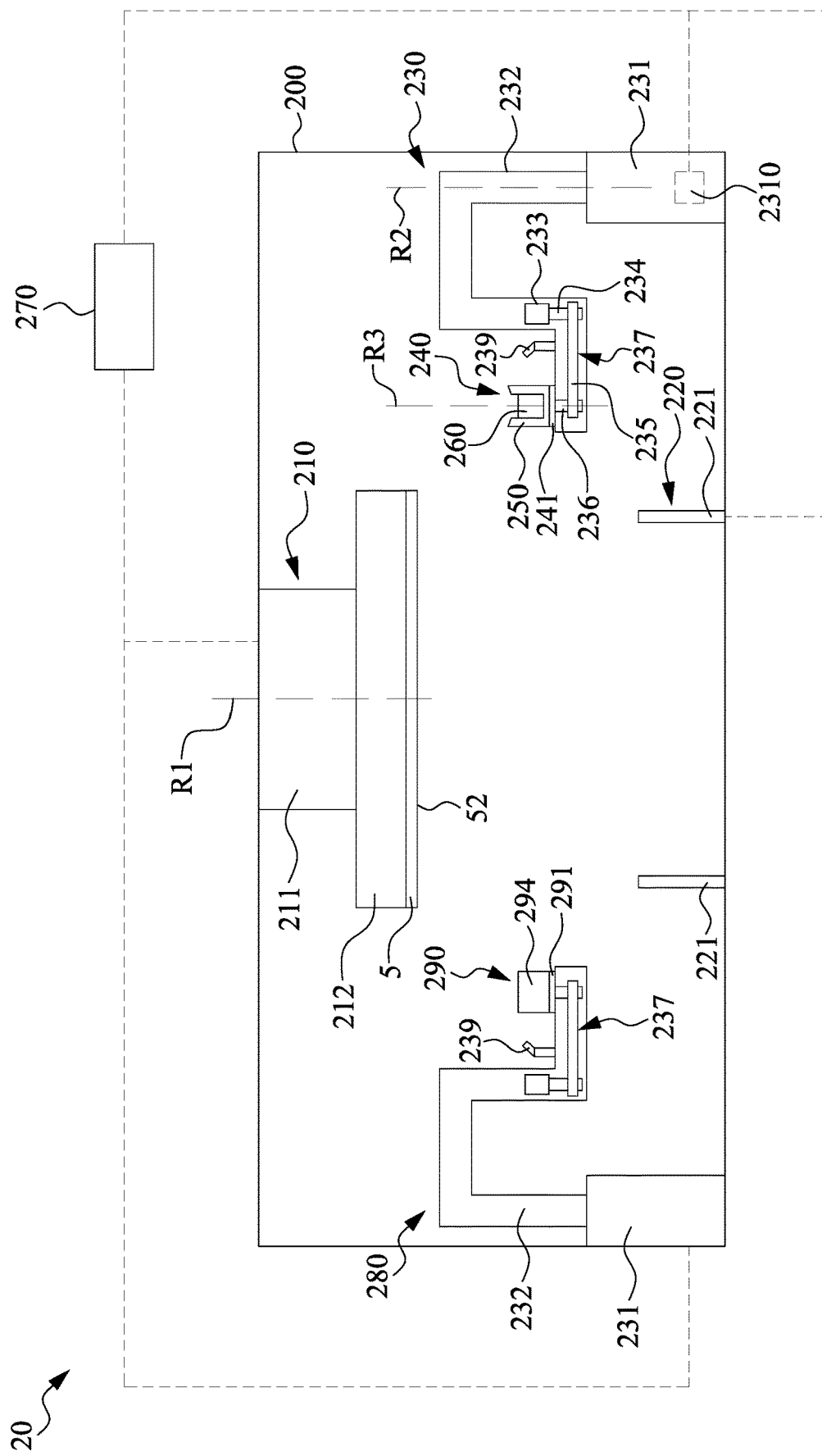
FIG. 2 is a schematic view of a backside polishing apparatus, in accordance with some embodiments of the present disclosure.

FIG. 2 is a schematic view of the backside polishing apparatus 20, in accordance with some embodiments of the present disclosure. In some embodiments, the backside polishing apparatus 20 includes a chamber 200, a wafer stage 210, a support 220, a first manipulating module 230, a first brush assembly 240, a controller 270, a second manipulating module 280, and a second brush assembly 290. The elements of the backside polishing apparatus 20 can be added to or omitted, and the invention should not be limited by the embodiment.

The wafer stage 210 is configured to hold the semiconductor wafer 5 during the backside polishing process. In some embodiments, the wafer stage 210 is positioned at an upper side wall of the chamber 200 and includes a manipulating mechanism 211 and a wafer holder 212. The manipulating mechanism 211 is controlled according to electric signals sent from the controller 270 to vertically move the semiconductor wafer 5 or rotate the semiconductor wafer 5 about a rotation axis R1. The wafer holder 212 is connected to the manipulating mechanism 211 and configured to physically hold the semiconductor wafer 5 with backside surface 52 of the semiconductor wafer 5 facing downwardly. The wafer holder 212 may clamp the semiconductor wafer 5 by multiple pins (not shown in figures). Alternatively, the wafer holder 212 may be a vacuum chuck to hold the semiconductor wafer 5 by vacuum. Alternatively, the wafer holder 212 may be an electrostatic chuck (E-chuck) to fix the semiconductor wafer 5 by electrostatic force.

The support 220 is configured to support the semiconductor wafer 5 before the semiconductor wafer 5 is loaded on the wafer stage 210 and after the semiconductor wafer 5 is unloaded from the wafer stage 210. In some embodiments, the support 220 is located below the wafer stage 210 and includes a number of pins 221. The pins 221 are controlled according to electric signals sent from the controller 270 to move the semiconductor wafer 5 along a vertical direction that is parallel to the rotation axis R1 to load the semiconductor wafer 5 to the wafer stage 210 or unload the semiconductor wafer 5 from the wafer stage 210.

The first brush assembly 240 and the second brush assembly 290 are configured to polish (otherwise clean) a backside surface 52 of the semiconductor wafer 5 in two sequentially performed backside polishing processes or polish the backside surface 52 of the semiconductor wafer 5 in two independently performed backside polishing processes. In some embodiments, the first brush assembly 240 and the second brush assembly 290 are respectively manipulated by the first manipulated module 230 and the second manipulated module 280 to move in different positions in the chamber 200.

In some embodiments, the first manipulated module 230 includes a base 231, an arm 232, a driving assembly 237 and a brush assembly 240. The arm 232 is movable connected to the base 231. In one embodiment of present disclosure, the base 231 includes one or more actuators 2310 for driving the movement of the arm 232 according to electrical signals issued by the controller 270. The arm 232 may be rotated by the actuator 2310 about a rotation axis R2. Alternatively, the arm 232 may be moved by the actuator 2310 along a vertical direction that is parallel to the rotation axis R2. The actuator 2310 may be servo motor, stepper motor, pneumatic devices or other suitable movement actuator.

The driving assembly 237 is configured to drive a rotation of the first brush assembly 240 around a rotation axis R3. In some embodiments, the driving assembly 237 is placed within the hollowed structure of the arm 232 and includes an actuator 233, a number of shafts, such as first shaft 234 and second shaft 236, and a belt 235. The first shaft 234 is connected to the actuator 233, and the second shaft 236 is connected to a base plate 241 of the first brush assembly 240. The belt 235 partially surrounds the first shaft 234 and the second shaft 236 and extends from the first shaft 234 to the second shaft 236. When the actuator 233 is driven, the belt 235 transmits rotation torque from the actuator 233 to the first brush assembly 240 via the first shaft 234 and the second shaft 236. The actuator 233 may include an electric motor or any other suitable component that is responsible for moving and controlling the first shaft 234 according to control signals.

Figure 3:
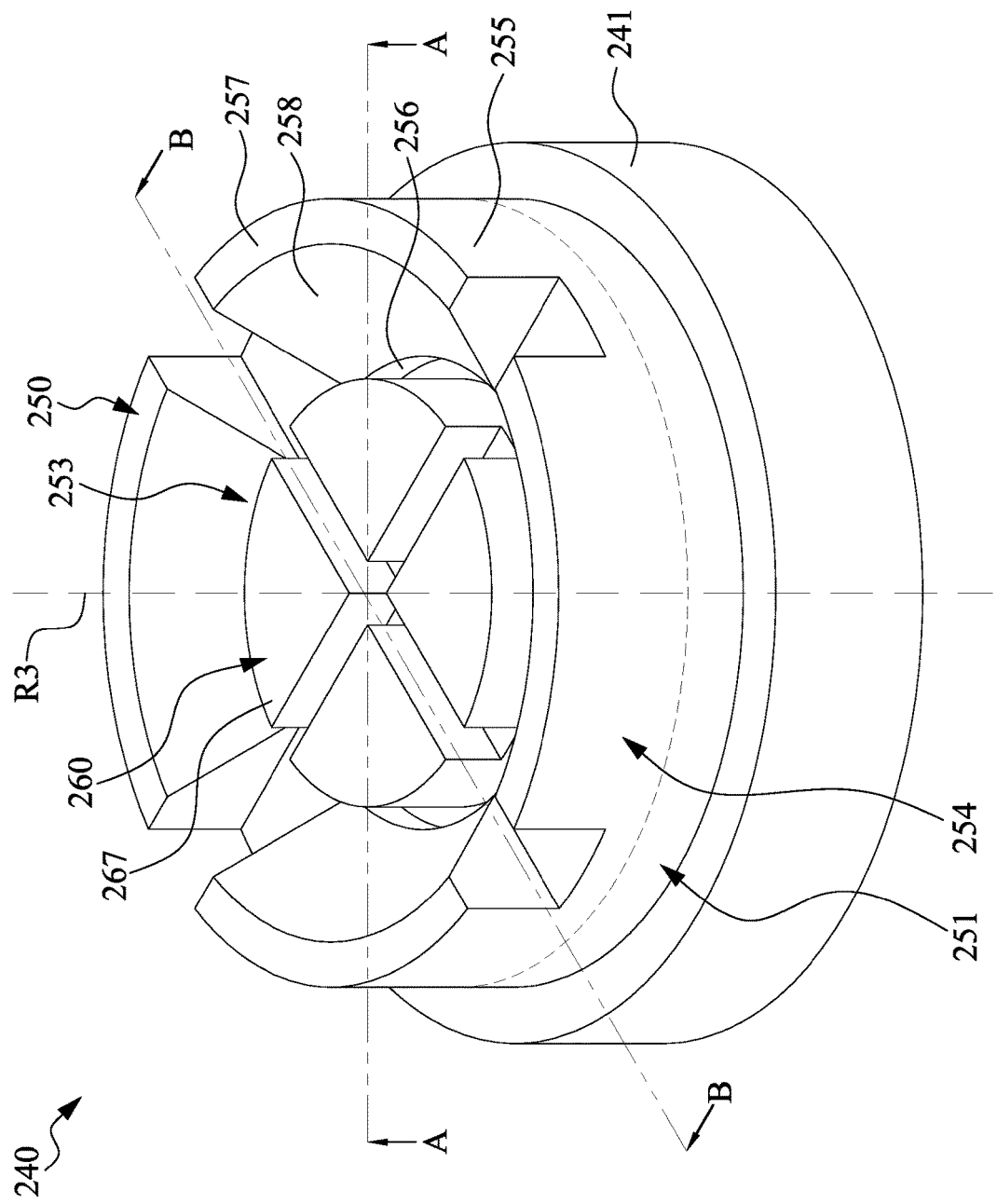
FIG. 3 is a schematic view of a first brush assembly, in accordance with some embodiments of the present disclosure.
Figure 4:
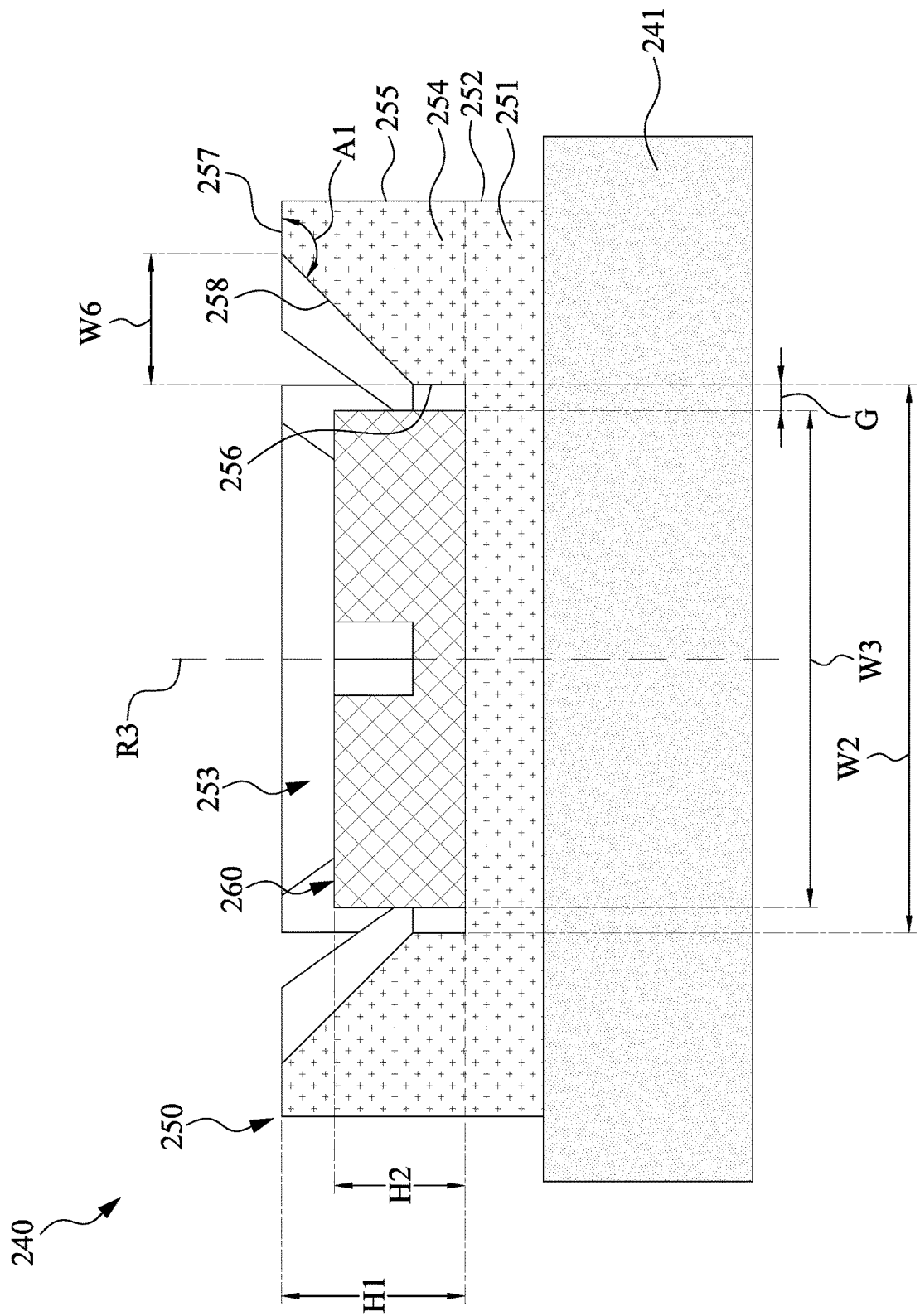
FIG. 4 is a cross-sectional view of the first brush assembly seen along a line A-A of FIG. 3.
Figure 5:
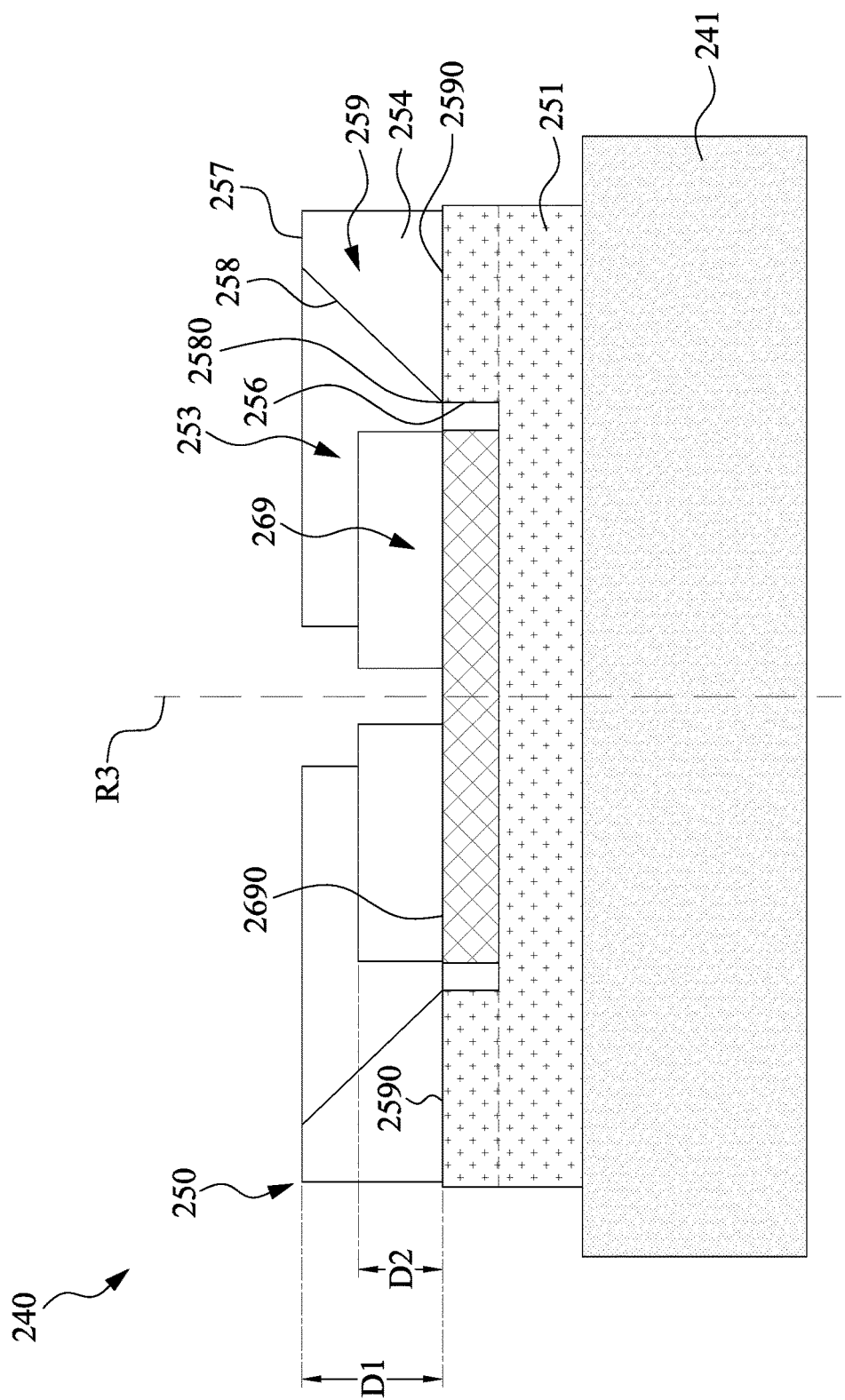
FIG. 5 is a cross-sectional view of the first brush assembly seen along a line B-B of FIG. 3.
Figure 6:
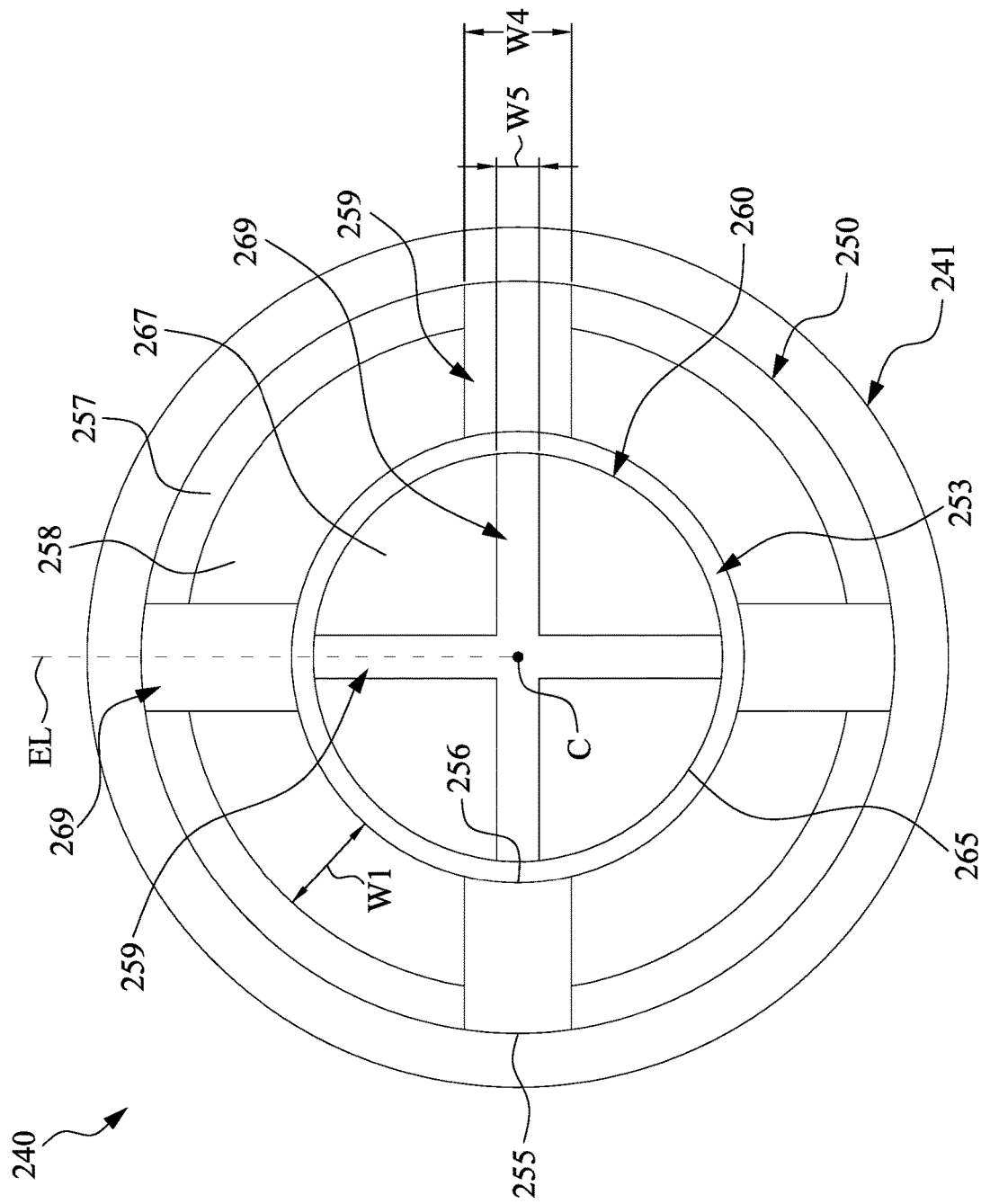
FIG. 6 is a plane view of the first brush assembly shown in FIG. 3.

FIG. 3 is a schematic view of a first brush assembly 240, in accordance with some embodiments of the present disclosure. FIG. 4 is a cross-sectional view of the first brush assembly 240 seen along a line A-A of FIG. 3. FIG. 5 is a cross-sectional view of the first brush assembly 240 seen along a line B-B of FIG. 3. FIG. 6 is a plane view of the first brush assembly 240 shown in FIG. 3. In some embodiments, the first brush assembly 240 includes a base plate 241, an outer brush member 250 and an inner brush member 260.

In some embodiments, the outer brush member 250 has a bottom portion 251 and a peripheral portion 254. The bottom portion 251 is fixed on the top surface of the base plate 241 by any suitable fastening method including screwing, clamping, interference fit, and the like. In one embodiment, the bottom portion 251 and the peripheral portion 254 are formed integrally. The bottom portion 251 may be formed in a disk shape that is conform with a shape of the base plate 241. In one exemplary embodiment, both the base plate 241 and the bottom portion 251 have a circular shape. However, it should be appreciated that many variations and modifications can be made to embodiments of the disclosure. The shape of the bottom portion 251 may be different from the shape of the base plate 241.

The peripheral portion 254 is connected to a side of the bottom portion 251 that is opposite to a side connected to the base plate 241. In some embodiments, the peripheral portion 254 has a ring shape and surrounds the rotation axis R3. The peripheral portion 254 extends away from the bottom portion 251 and terminates at an upper end surface 257 to define an accommodation space 253 with the bottom portion 251 for receiving the inner brush member 260. The peripheral portion 254 has an outer surface 255 and an inner surface 256. The inner surface 256 of the peripheral portion 254 faces the accommodation space 253 and has a circular shape as seen from a top view shown in FIG. 6. The outer surface 255 is opposite to the inner surface 256 and flushes with an outer edge 252 (see FIG. 4) of the bottom portion 251. The upper end surface 257 may be perpendicular to the outer surface 255.

In some embodiments, the peripheral portion 254 of the outer brush member 250 is tapered in a direction away from the bottom portion 251. Specifically, a beveled edge (or chamfer edge) 258 is formed between the inner surface 256 to the upper end surface 257. An included angle A1 (see FIG. 4) between the beveled edge 258 and the upper end surface 257 may be in a range from about 120 degrees to about 150 degrees. For example, the included angle A1 between the beveled edge 258 and the upper end surface 257 is about 135 degrees. In some embodiments, a width W6 of the beveled edge 258 is in a range from about 2 mm to about 5 mm. For example, the width W6 of the beveled edge 258 as seen from the top view is 5 mm. The bevel edge 258 facilitates a bending of the outer brush member 250 after contacting with the semiconductor wafer 5.

In some embodiments, the inner brush member 260 is received in the accommodation space 253 and surrounded by the outer brush member 250. In some embodiments, the inner brush member 260 is fixed on the bottom portion 251 of the outer brush member 250 with a center of the inner brush member 260 aligning with a center of the bottom portion 251 of the outer brush member 250. The inner brush member 260 may be fix on the bottom portion 251 of the outer brush member 250 by any suitable fastening method including screwing, clamping, interference fit, and the like. However, it should be appreciated that many variations and modifications can be made to embodiments of the disclosure. In some embodiments, the bottom portion 251 is omitted, and the peripheral portion 254 and the inner brush member 260 are fixed on the base plate 241 directly.

In some embodiments, the dimensions of the accommodation space 253 are selected to allow the inner brush member 260 to be completely received in the accommodation space 253. As such, as shown in FIG. 4, a depth H1 of the accommodation space 253 (or a distance between the upper end surface 257 to the bottom portion 251) is greater than a height H2 of the inner brush member 260. In one exemplary embodiment, the depth H1 is about 7 mm and the height H2 is about 5 mm. A difference between the depth H1 and the height H2 is about 2 mm. The difference between the depth H1 and the height H2 enables the outer brush member 250 to contact the semiconductor wafer 5 earlier than the inner brush member 260 when the first brush assembly 240 moves toward the semiconductor wafer 5. However, it should be appreciated that many variations and modifications can be made to embodiments of the disclosure. In some embodiments, the depth H1 may be equal to the height H2.

In addition, an inner diameter W2 is slightly greater than an outer diameter W3 of the inner brush member 260. In one exemplary embodiment, the inner diameter W2 is about 21 mm and the outer diameter W3 of the inner brush member 260 is about 19 mm. As a result, a gap G is formed between the inner brush member 260 and the peripheral portion 254 of the outer brush member 250. The gap G has a width of about 1 mm. The gap G between the inner brush member 260 and the outer brush member 250 provides a space for the inner brush member 260 to expand after absorbing processing liquid during the backside polishing process. However, it should be appreciated that many variations and modifications can be made to embodiments of the disclosure. In another embodiment, the inner diameter W2 is equaled to the outer diameter W3 of the inner brush member 260, and the inner brush member 260 tightly fits into the accommodation space 253.

In some embodiments, the inner brush member 260 is made of a material different from a material of the outer brush member 250. In some embodiments, the outer brush member 250 includes a material having a lower rigidity (or hardness) than the material of the inner brush member 260. In one exemplary embodiment, the inner brush member 260 is made of material having absorption properties, such as polyvinyl alcohol (PVA), and the outer brush member 250 is made of resin material, such as RN. In such embodiment, the outer brush member 250 is bent outwardly by a compression force while the upper end surface 257 of the outer brush member 250 attaches with the semiconductor wafer 5 during the backside polishing process. However, it should be appreciated that many variations and modifications can be made to embodiments of the disclosure. In some other embodiments, the inner brush member 260 and the outer brush member 250 are made of the same material. For example, the inner brush member 260 is made of RN, and the outer brush member 250 is made of RN.

In some embodiments, a number of grooves are formed on surfaces of the outer brush member 250 that are directly contact with the semiconductor wafer 5 to guide the processing liquid running out of the outer brush member 250. For example, as shown in FIG. 6, the outer brush member 250 has four grooves (hereinafter, referred to as "outer groove") 259. The four outer grooves 259 are formed on the upper end surface 257 and radially extend from the inner surface 256 to the outer surface 255 of the peripheral portion 254. The four outer grooves 259 may be spaced from one another by the same angle of circumference. In some embodiments, the angle of circumference is of about 90 degrees, and the extension direction of each of the outer grooves is perpendicular to the inner surface 256 and to the outer surface 255.

In some embodiments, as shown in FIG. 5, each of the outer grooves 259 has a depth D1 equaled to a height of the beveled edge 258 in a direction that is parallel to the rotation axis R3. As a result, a lower end 2580 of the beveled edge 258 intersects with a bottom surface 2590 of the each of the outer grooves 259. In one exemplary embodiment, the depth D1 of each of the outer grooves 259 and a height of the beveled edge 258 in a direction that is parallel to the rotation axis R3 are of about 5 mm. In some embodiments, each of the outer grooves 259 has a width W4 (see FIG. 6) equaled to depth D1 of each of the outer grooves 259. In one exemplary embodiment, the width W4 of each of the outer grooves 259 is of about 5 mm.

In some embodiments, in addition to the outer grooves 259 formed on the outer brush member 250, a number of grooves are formed on a surface of the inner brush member 260 that are directly contact with the semiconductor wafer 5 to guide the processing liquid running out of the inner brush member 260. For example, as shown in FIG. 6, the inner brush member 260 has four grooves (hereinafter, referred to as "inner groove") 269. The four inner grooves 269 are formed on an upper end surface 267 of the inner brush member 260 and radially extend from a center C of the upper end surface 267 to an outer surface 265 of the inner brush member 260. The four inner grooves 269 may be spaced from one another by the same angle of circumference. In some embodiments, the angle of circumference is of about 90 degrees, and the extension direction of each of the four inner grooves 269 is perpendicular to the outer surface 265 of the inner brush member 260.

In some embodiments, the extension direction of the inner groove 269 aligns with the extension direction of an adjacent outer groove 259. For example, as shown in FIG. 6, an extension line EL passes through the center C of the inner brush member 260 and perpendicularly intersect with the outer surface 255 of the outer brush member 250. One of the four inner grooves 269 and one of the four outer grooves 259 extend along the extension line EL. As such, the processing liquid for backside polishing process is efficiently drained through the inner grooves 269 and the outer grooves 259. However, it should be appreciated that many variations and modifications can be made to embodiments of the disclosure. In some other embodiments, the two neighboring grooves on the inner brush member 260 and the outer brush member 250 are arranged in a staggered manner.

In some embodiments, the bottom surfaces of two radially neighboring grooves on the inner brush member 260 and the outer brush member 250 have the same height relative to the base plate 241. For example, as shown in FIG. 5, a bottom surface 2590 of one of the outer grooves 259 and a bottom surface 2690 of one of the inner grooves 269 have the same height relative to the base plate 241 and are located at the same plane that is parallel to the base plate 241. As such, the processing liquid for backside polishing process is efficiently drained through the inner grooves 269 and the outer grooves 259. However, it should be appreciated that many variations and modifications can be made to embodiments of the disclosure. In some other embodiments, the bottom surface 2590 of one of the outer grooves 259 and the bottom surface 2690 of one of the inner grooves 269 have different height relative to the base plate 241. For example, the bottom surface 2690 of one of the inner grooves 269 is higher than the bottom surface 2590 of one of the outer grooves 259.

It will be noted that although FIGS. 3-6 illustrate four grooves formed on each of the inner brush member 260 and the outer brush member 250 to drain the processing liquid in backside polishing process, the first brush assembly 240 can include any number of grooves on the inner brush member 260 and the outer brush member 250 to guide the flowing of processing liquid. In some embodiments, the inner grooves 269 formed on the inner brush member 260 are omitted, and the processing liquid is drained from the inner brush member 260 to outside through the outer grooves 259.

Referring to FIG. 2, the second manipulate module 280 is configured to manipulate the movement of the second brush assembly 290 in the chamber 200. In some embodiments, the second manipulate module 280 has a configuration similar to the first manipulate module 230 and includes a base 231, an arm 232, a driving assembly 237. Thus, the discussion of the first manipulate module 230 applies to the second manipulate module 280, unless mentioned otherwise.

Figure 7:
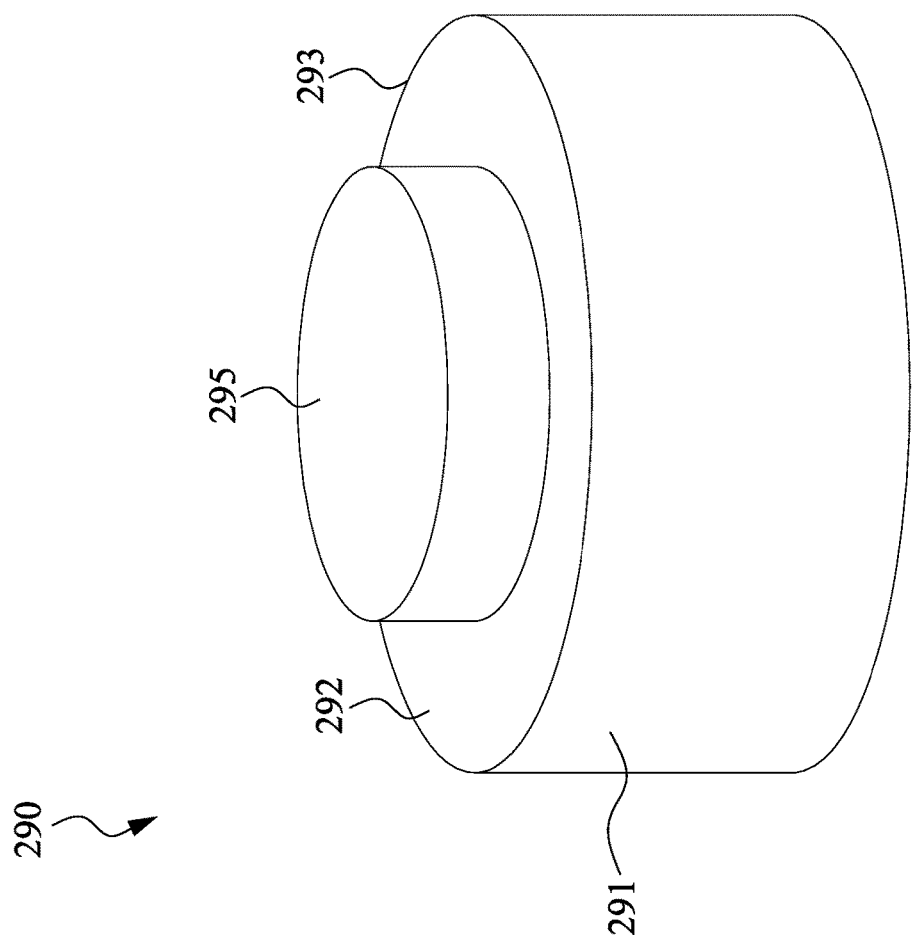
FIG. 7 is a schematic view of a second brush assembly, in accordance with some embodiments of the present disclosure.

In some embodiments, as shown in FIG. 7, the second brush assembly 290 includes a base plate 291 and a brush member 295. The base plate 291 is mounted on the arm 232 and connected to the driving assembly 237 (see FIG. 2). The brush member 295 is fixed on a top surface 292 of the base plate 291 by any suitable fastening method including screwing, clamping, interference fit, and the like. The brush member 295 is formed in a cylinder shape. In one embodiment, there is only one brush member 295 positioned on the base plate 291, and no other brush member is positioned between the brush member 295 and an outer edge 293 of the base plate 291.

Figure 8:
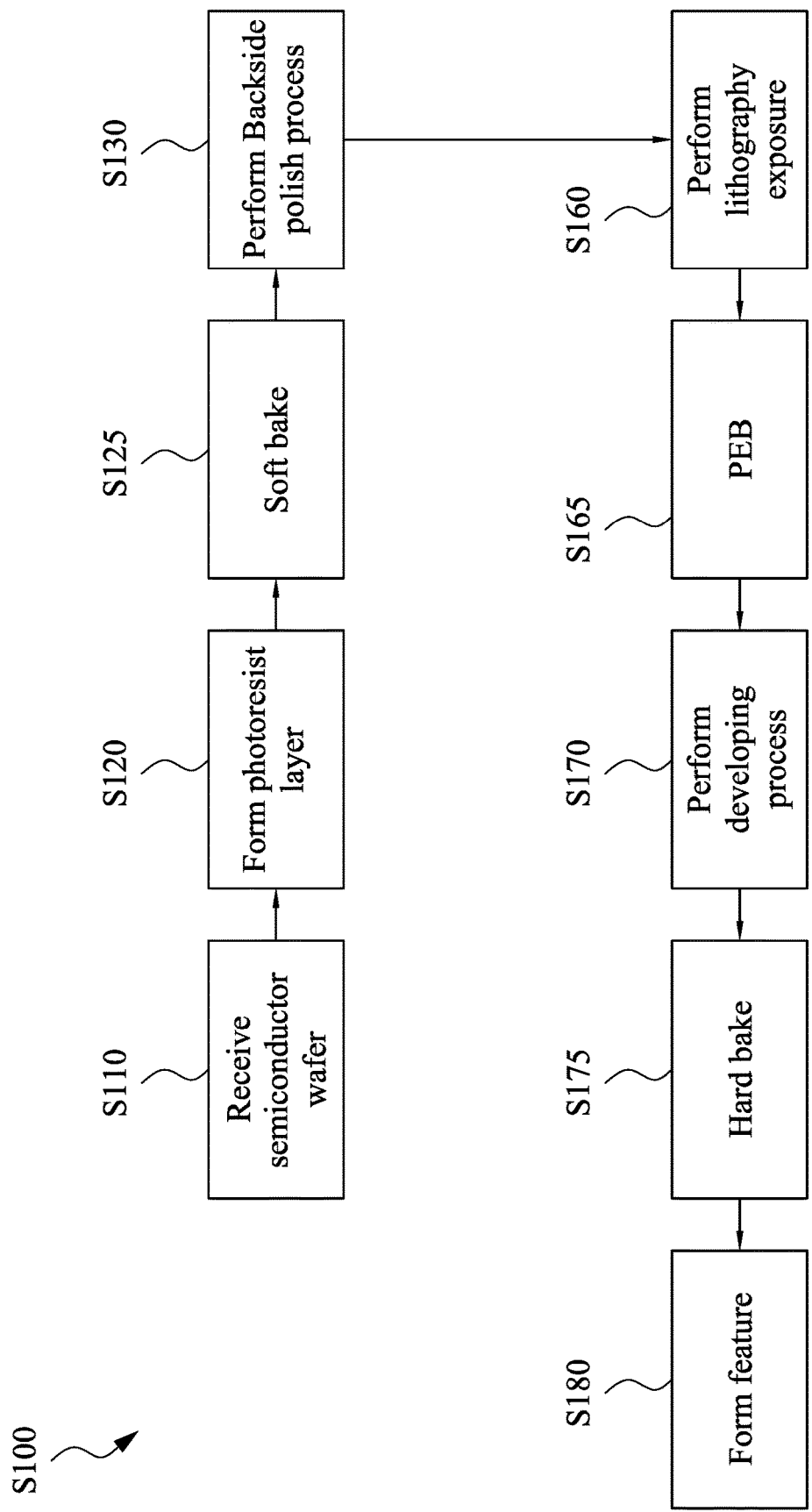
FIG. 8 is a flow chart of a method of forming patterns on a semiconductor wafer, in accordance with some embodiments of the present disclosure.

FIG. 8 shows a flow chart of a wafer processing method S100 according to some embodiments of the present disclosure, and FIG. 9 shows details of operation S130 of the wafer processing method S100. For illustration, the flow chart of FIGS. 8 and 9 will be described along with the schematic views shown in FIGS. 10A-10K and 11-13. The illustration is merely exemplary and is not intended to limit beyond what is specifically recited in the claims that follow. It is understood that additional operations may be provided before, during, and after the steps shown by FIGS. 8 and 9, and some of the steps described below can be replaced or eliminated in additional embodiments of the method. The order of the operations/processes may be interchangeable.

The wafer processing method S100 is configured to form a pattern on the semiconductor wafer 5. The wafer processing method S100 includes operation S110, in which a semiconductor wafer 5 is received into the semiconductor fabricating system 100.

Figure 11:
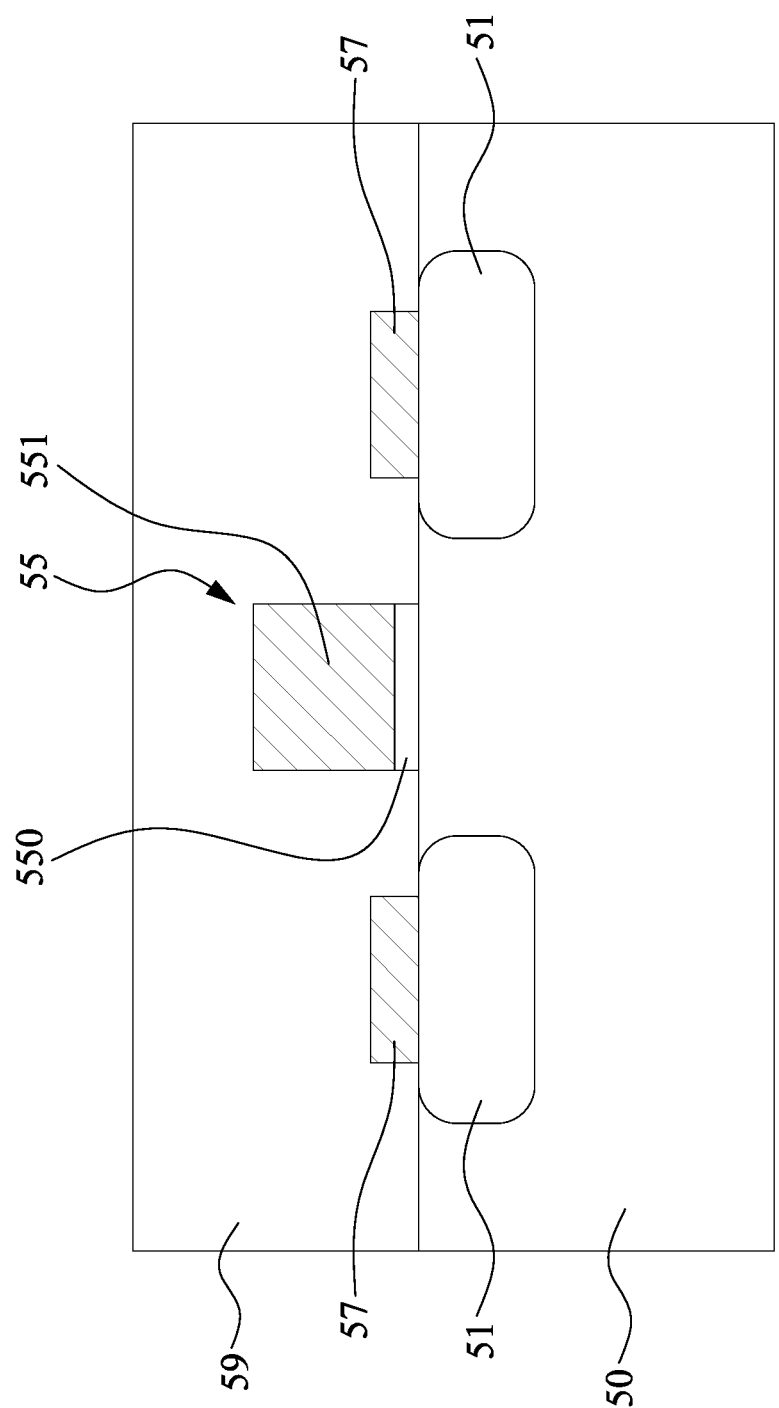
FIG. 11 is a schematic view of a method of forming multiple features on semiconductor wafer, in accordance with some embodiments of the present disclosure.

In some embodiments, as shown in FIG. 11 before the semiconductor wafer 5 is sent to the semiconductor fabricating system 100, some features are formed on the semiconductor wafer 5. Specifically, source/drain regions 51 are formed in the N-well region 50 of the semiconductor wafer. An implantation process is performed to form the source/drain regions 51. In some embodiments, P-type dopants are implanted into the N-well region 50 to form the source/drain regions 51. Afterwards, an annealing process, such as a rapid thermal process (RTP), may be performed to repair the crystal structure of the silicon in the source/drain regions 51 and activate the dopant in the source/drain regions 51.

In some embodiments, two features 55 are formed over the semiconductor wafer 5, in accordance with some embodiments. For example, the two features 55 are formed between the two source/drain regions 51. In some embodiments, each of the two features 55 includes a gate dielectric layer 550 over the N-well region 50 of the semiconductor wafer 5 and a gate electrode 551 over the gate dielectric layer 550.

In some embodiments, the gate dielectric layer 550 is made of silicon oxide, silicon nitride, silicon oxynitride, high-k material, any other suitable dielectric material, or a combination thereof. In some embodiments of the present disclosure, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, any other suitable high-k dielectric material, or a combination thereof.

In some embodiments, the gate electrode 551 is made of polysilicon, a metal material, another suitable conductive material, or a combination thereof. In some embodiments of the present disclosure, the metal material may include, but is not limited to, copper, aluminum, tungsten, molybdenum, titanium, tantalum, platinum, or hafnium. In some embodiments, the gate electrode 551 is a dummy gate electrode and will be replaced with another conductive material such as a metal material. The dummy gate electrode layer is made of, for example, polysilicon.

In some embodiments, two features 57 are formed over the source/drain regions 51. In some embodiments of the present disclosure, each of the features 57 include a metal layer. In some embodiments, the metal layer includes, but is not limited to, nickel silicide, cobalt silicide, tungsten silicide, titanium silicide, tantalum silicide, platinum silicide or erbium silicide.

In some embodiments, a dielectric layer 59 is formed over the features 57. In some embodiments, a dielectric layer 59 is deposited to cover the source/drain regions 51, the features 55 and the features 57. In some embodiments, the dielectric layer includes silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric layer is deposited using a CVD process, an ALD process, a spin-on process, a spray coating process, another applicable process, or a combination thereof.

Figure 12:
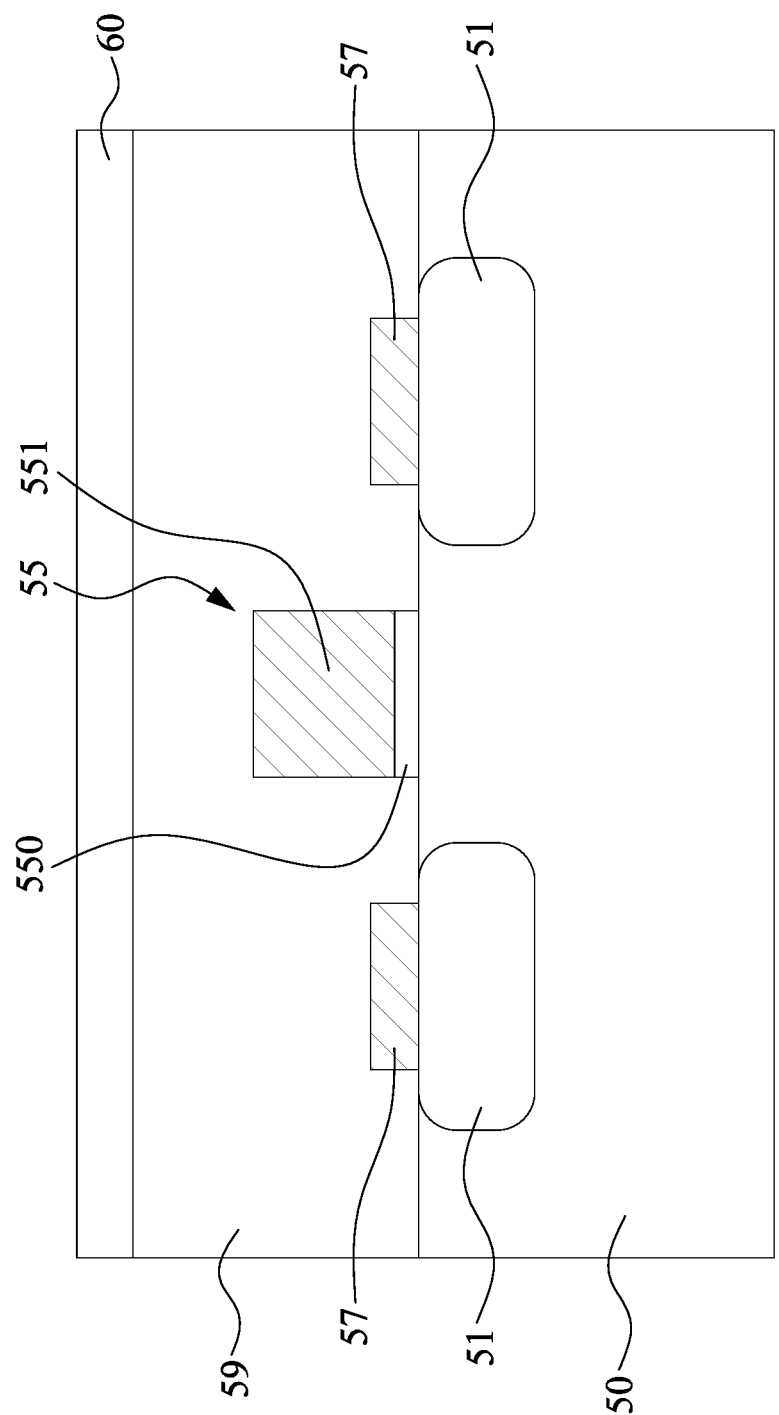
FIG. 12 is a schematic view of a method of patterning a photoresist layer on a semiconductor wafer, in accordance with some embodiments of the present disclosure.

The wafer processing method S100 also includes operation S120, in which a photoresist layer 60 is coated on a surface of a semiconductor wafer 5. In some embodiments, as shown in FIG. 12, the photoresist layer 60 is formed on a top of the dielectric layer 59. The photoresist layer 60 is either a positive tone resist or a negative tone photoresist. A positive tone photoresist refers to a photoresist that when exposed to radiation (typically UV light, e.g., EUV) becomes soluble in a developer, while the region of the photoresist that is non-exposed (or exposed less) is insoluble in the developer. A negative tone photoresist, on the other hand, refers to a photoresist that when exposed to radiation becomes insoluble in the developer, while the region of the photoresist that is non-exposed (or exposed less) is soluble in the developer. The region of a negative photoresist that becomes insoluble upon exposure to radiation may become insoluble due to a cross-linking reaction caused by the exposure to radiation. The wafer processing method S100 also includes operation S125, in which the semiconductor wafer 5 including the photoresist 60 is baked, in a soft bake operation, to drive out solvent in the photoresist and solidify the photoresist 60.

In some embodiments, after the coating of the photoresist layer 60, partial area of the backside surface 52 may be contaminated by the photoresist material. Contaminants on the backside surface 52 of the semiconductor wafer 5 will lead to a failure to focus the image on the surface of the wafer in the subsequent lithography exposure process, thereby causing the product to be scrapped. To clean up the photoresist material on the backside surface 52, the wafer processing method S100 continues with operation S130, in which a backside polishing process is performed.

Figure 10A:
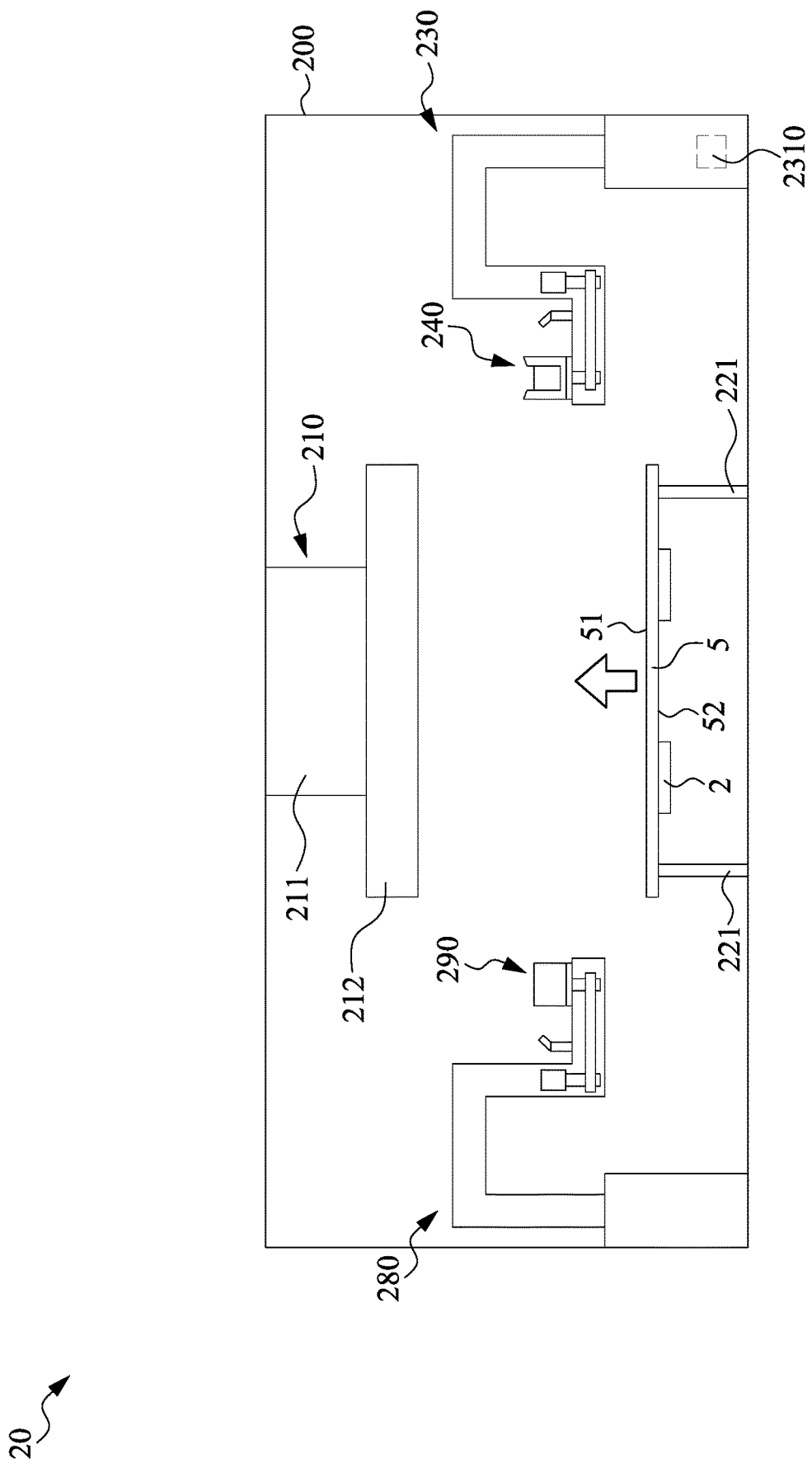
FIG. 10A is a schematic view of one stage of a method for a backside polishing process according to some embodiments of the present disclosure, wherein a semiconductor is delivered into a chamber of a backside polishing module.
Figure 10B:
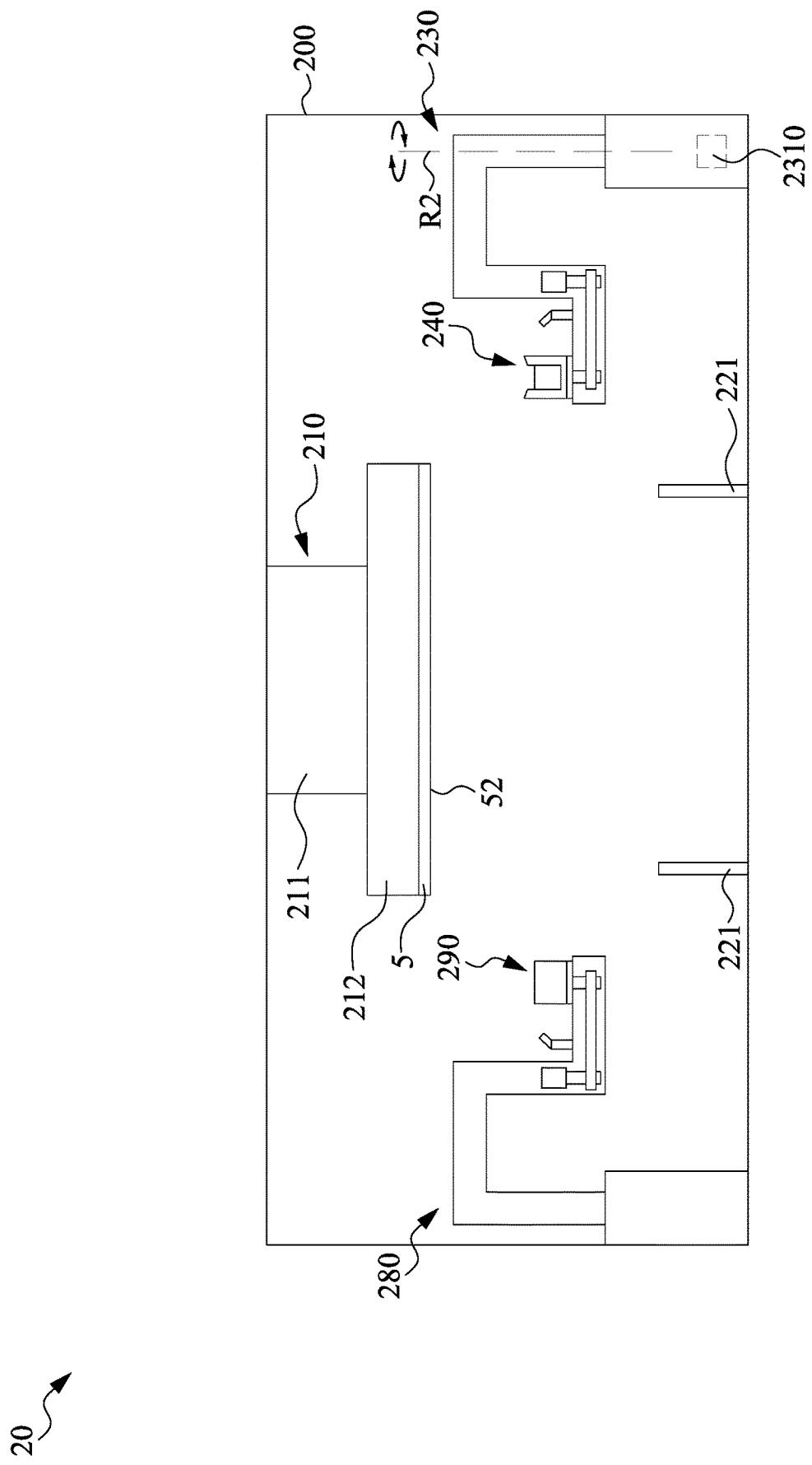
FIG. 10B is a schematic view of one stage of a method for a backside polishing process according to some embodiments of the present disclosure, wherein a semiconductor wafer is held by a wafer stage with a backside surface facing downwardly.

Referring to FIG. 9, the backside polishing process includes operation S131, in which the semiconductor wafer 5 is loaded on the wafer stage 210. In some embodiments, as shown in FIG. 10A, the semiconductor wafer 5 is moved into the chamber 200 by a robot arm 2. The robot arm 2 places the semiconductor wafer 5 on the pins 221 of the support 220 and moves outside of the chamber 200. After the semiconductor wafer 5 is placed on the pins 221, the pins 221 lift the semiconductor wafer 5 along a direction as indicated by an arrow shown in FIG. 10A, and then the semiconductor wafer 5 is fixed by the wafer holder 212 with the backside surface 52 of the semiconductor wafer 5 facing downwards, as shown in FIG. 10B.

The backside polishing process includes operation S140 to perform a first polishing stage. In some embodiments, the first polishing stage includes operation S141 in which a first brush assembly 240 is moved toward the backside surface 52 of the semiconductor wafer 5 to enable the inner brush member 260 and the outer brush member 250 of the first brush assembly 240 are in contact with the backside surface 52 of the semiconductor wafer 5. In some embodiments, as shown in FIG. 10B, the actuator 2310 of the first manipulate module 230 is controlled to rotate the arm 232 about the rotation axis R2 to move the first brush assembly 240. In some embodiments, the rotation of the arm 232 is stopped when the first brush assembly 240 is moved to a position below the semiconductor wafer 5 as shown in FIG. 10C.

Figure 10C:
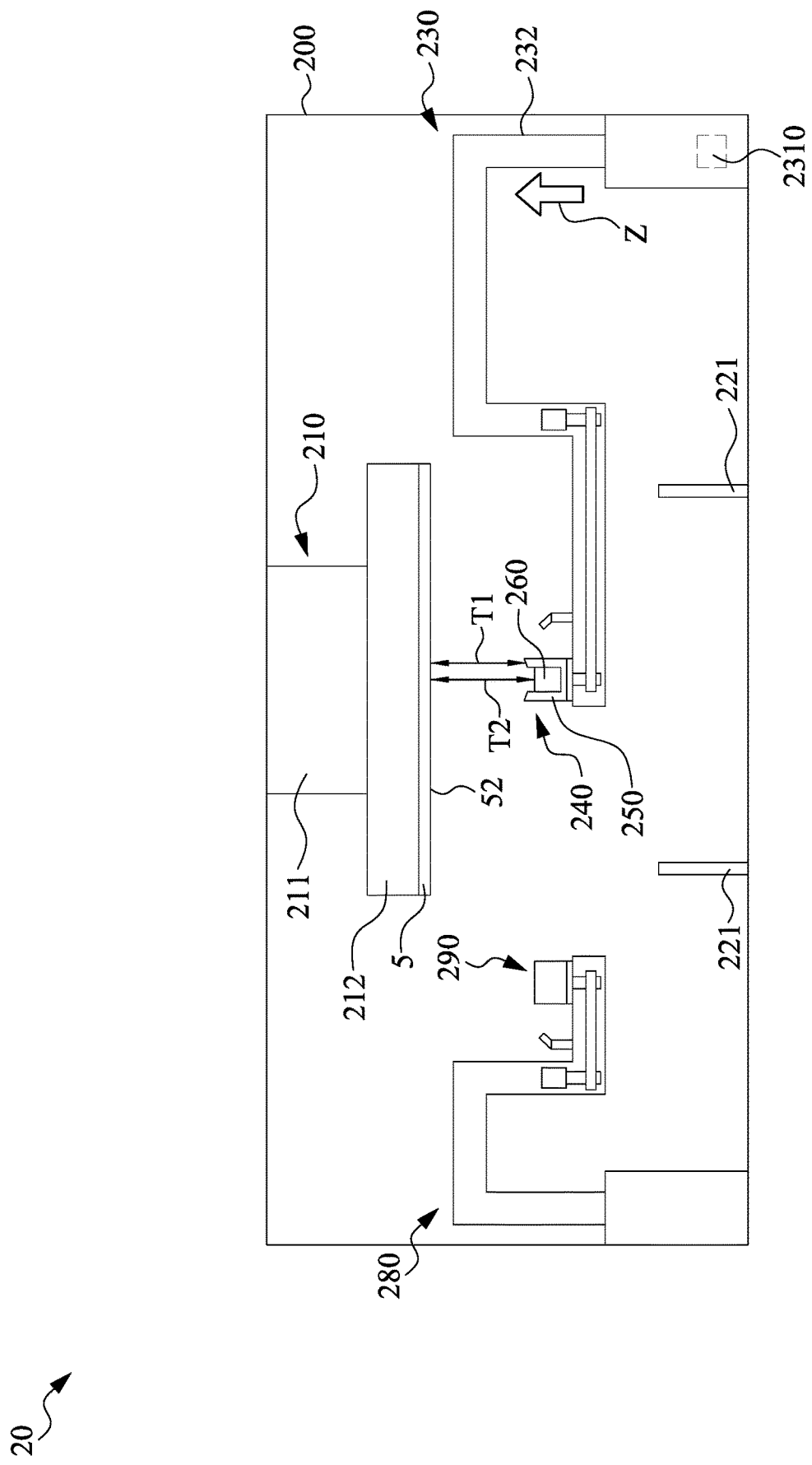
FIG. 10C is a schematic view of one stage of a method for a backside polishing process according to some embodiments of the present disclosure, wherein a first brush assembly is moved below a backside surface of a semiconductor wafer.

After the first brush assembly 240 is moved to a position below the semiconductor wafer 5, as shown in FIG. 10C, the outer brush member 250 is distant from the backside surface 52 of the semiconductor wafer 5 by a first distance T1 and the inner brush member 260 is distant from the backside surface 52 of the semiconductor wafer 5 by a second distance T2. Since the upper end surface 257 of the outer brush member 250 is higher than the upper end surface 267 of the inner brush member 260, the second distance T2 is greater than the first distance T1. In one exemplary embodiment, the difference between the second distance T2 and the first distance T1 is about 2 mm.

In some embodiments, the actuator 2310 of the first manipulate module 230 is controlled to lift the arm 232 along a direction as indicated by an arrow Z shown in FIG. 10C, so as to move the first brush assembly 240 toward the backside surface 52 of the semiconductor wafer 5. The first brush assembly 240 may be moved in a manner that the rotation axis R1 and the rotation axis R3 are overlapped.

Figure 10D:
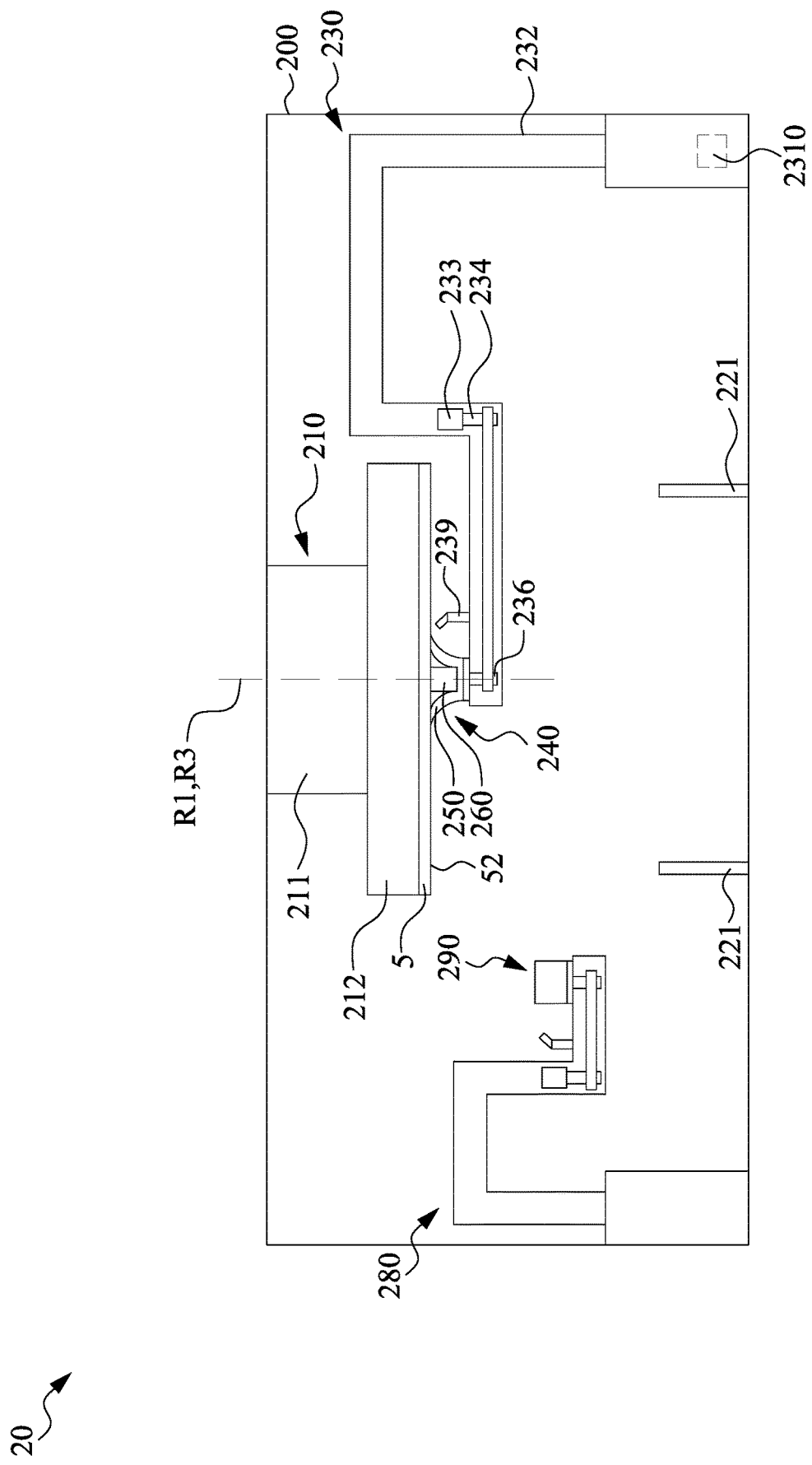
FIG. 10D is a schematic view of one stage of a method for a backside polishing process according to some embodiments of the present disclosure, wherein a first brush assembly is moved to a first position relative to a semiconductor wafer.

In some embodiments, the vertical movement distance of the first brush assembly 240 is determined by the second distance T2 between the inner brush member 260 and the backside surface 52 of the semiconductor wafer 5. As a result, as shown in FIG. 10D, the vertical movement of the first brush assembly 240 is stopped when the inner brush member 260 just touches the backside surface 52 of the semiconductor wafer 5. In addition, when the vertical movement of first brush assembly 240 is stopped, the outer brush member 250 is bent outwardly by a compression pressure from the backside surface 52 of the semiconductor wafer 5. In one exemplary embodiment, the vertical movement of the first brush assembly 240 resulting in a push load on the backside surface 52 of the semiconductor wafer 5 in a range from about 1N to 9N, for example 9N.

Figure 10E:
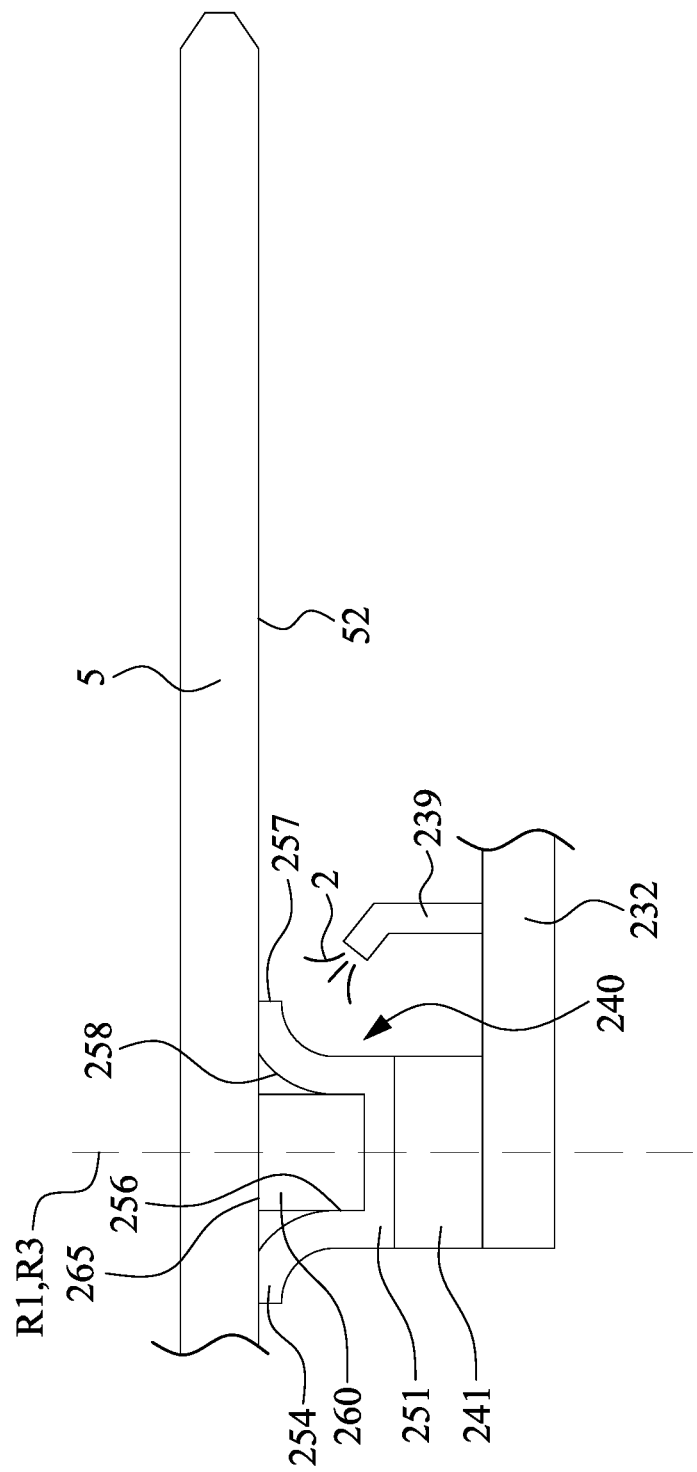
FIG. 10E is a schematic view of one stage of a method for a backside polishing process according to some embodiments of the present disclosure, wherein a first brush assembly is in contact with a backside surface of a semiconductor wafer.

Specifically, as shown in FIG. 10E, when the upper end surface 267 of the inner brush member 260 just touches the backside surface 52 of the semiconductor wafer 5, the peripheral portion 254 is bent outwardly and creates a contact between the beveled edge 258 (otherwise partial of the upper end surface 257) and the backside surface 52 of the semiconductor wafer 5. In some embodiments, since the formation of the beveled edge 258, the peripheral portion 254 can be tightly fit on the backside surface 52 of the semiconductor wafer 5 in comparison a peripheral portion without tapered structures.

The first polishing stage also includes operation S142, in which a processing liquid is suppled over the first brush assembly 240. In some embodiments, as shown in FIG. 10E, after the vertical movement of the first brush assembly 240 is finished, the processing liquid 2 is supplied by the dispenser 239. The processing liquid 2 may include a cleaning liquid, such as deionized water (DIW).

Figure 10F:
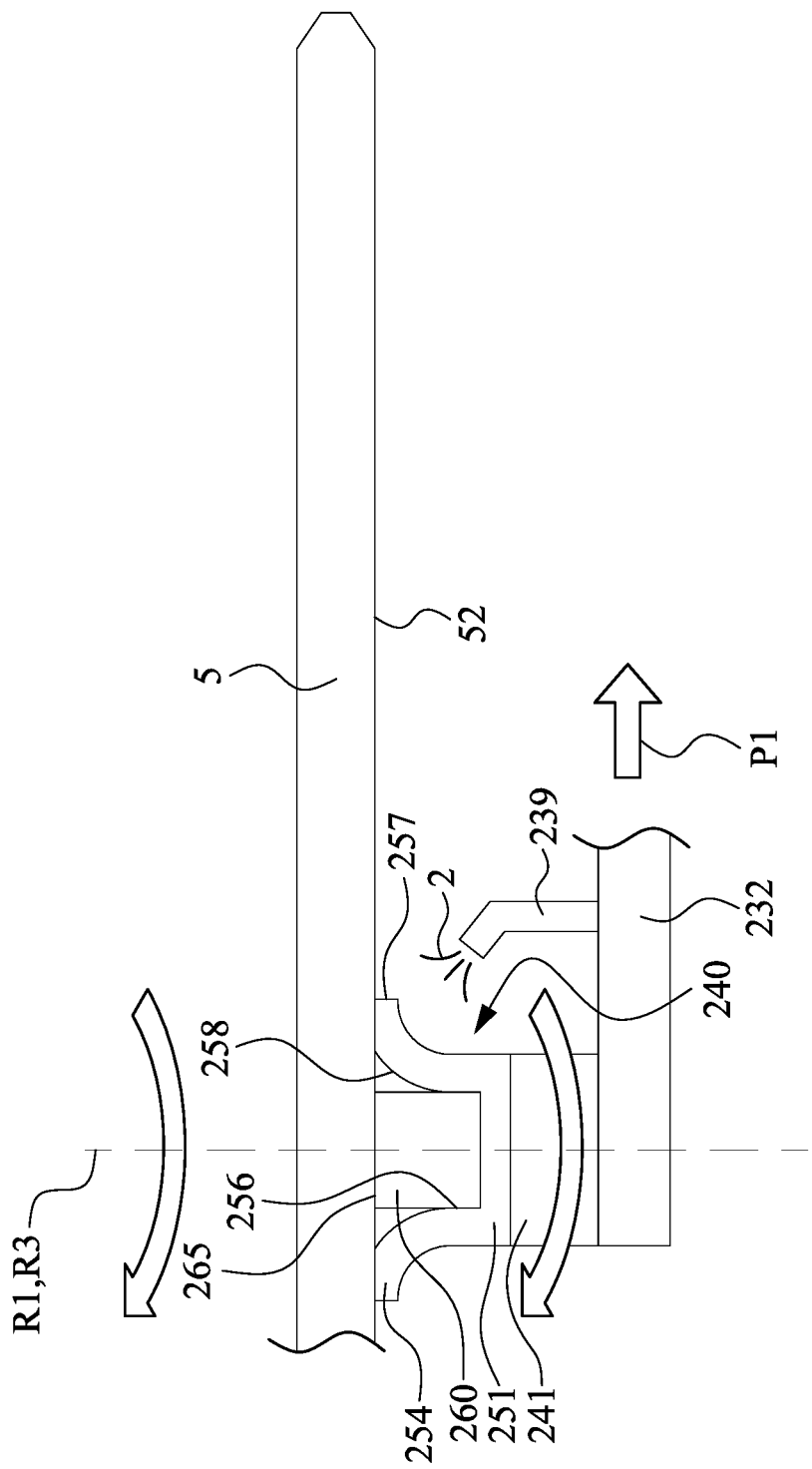
FIG. 10F is a plane view of the first brush assembly according to some embodiments of the present disclosure, wherein an inner brush member is soaked by a processing liquid and an outer brush member is bent outwardly.

The first polishing stage also includes operation S143, in which the first brush assembly is rotated relative to the semiconductor wafer for a first predetermined time. In some embodiments, as shown in FIG. 10F, after the first brush assembly 240 is in contact with the backside surface 52 of the semiconductor wafer 5, the first brush assembly 240 is rotated about the rotation axis R3 in a speed of about 300 rpm to about 500 rpm to polish the backside surface 52 of the semiconductor wafer 5. In the same time, the semiconductor wafer 5 is rotated by the wafer stage 210 about the rotation axis R1 in a speed of about 2000 rpm. In some embodiments, the rotation direction of the first brush assembly 240 and the rotation direction of the semiconductor wafer 5 are same. Alternatively, the rotation direction of the first brush assembly 240 is opposite to the rotation direction of the semiconductor wafer 5.

FIG. 10G shows a top view of the first brush assembly 240, in accordance with some embodiments. In some embodiments, after the first brush assembly 240 is compressed by the semiconductor wafer 5, the peripheral portion 254 of the outer brush member 250 is outwardly bent. Therefore, as seen from the top view shown in FIG. 10G, a vertical projection of a portion of the peripheral portion 254 of the outer brush member 250 is located outside of the base plate 241, which provides a greater contact area for the backside surface 52 of the semiconductor wafer 5 and reduces the time for performing the backside polishing process.

In some embodiments, since the inner brush member 260 is made of absorption properties material, the inner brush member 260 may absorb the processing liquid 2 and expands in size. As shown in FIG. 10G, the expansion of the inner brush member 260 causes a contact between the outer surface 265 of the inner brush member 260 and the inner surface 256 of the outer brush member 250, and the width of the gap G decreases close to zero.

In some embodiments, after the inner brush member 260 is expanded due to liquid absorption, the inner grooves 269 are immediately connected to the adjacent outer grooves 259. Therefore, the process liquid 2 along with particles removed from the backside surface 52 of the semiconductor wafer 5 can be efficiently drained through the inner grooves 269 and the outer grooves 259, and a concern that scratches on the backside surface 52 of the semiconductor wafer 5 produced by rubbing with particles can be mitigated.

The first polishing stage also includes operation S144, in which the first brush assembly 240 is moved back and forth along a traveling path. In some embodiments, as shown in FIG. 10F, the first brush assembly 240 is moved from a center of the semiconductor wafer 5 (i.e., a first position) to a peripheral region of the semiconductor wafer 5 (i.e., a second position) along a traveling path P1. The traveling path P1 is parallel to the back surface 52 of the semiconductor wafer 5. As a result, during the outwardly horizontal movement of the first brush assembly 240, the first brush assembly 240 applies the same compression force (e.g., 9N) on the backside surface 52 of the semiconductor wafer 5.

Figure 10H:
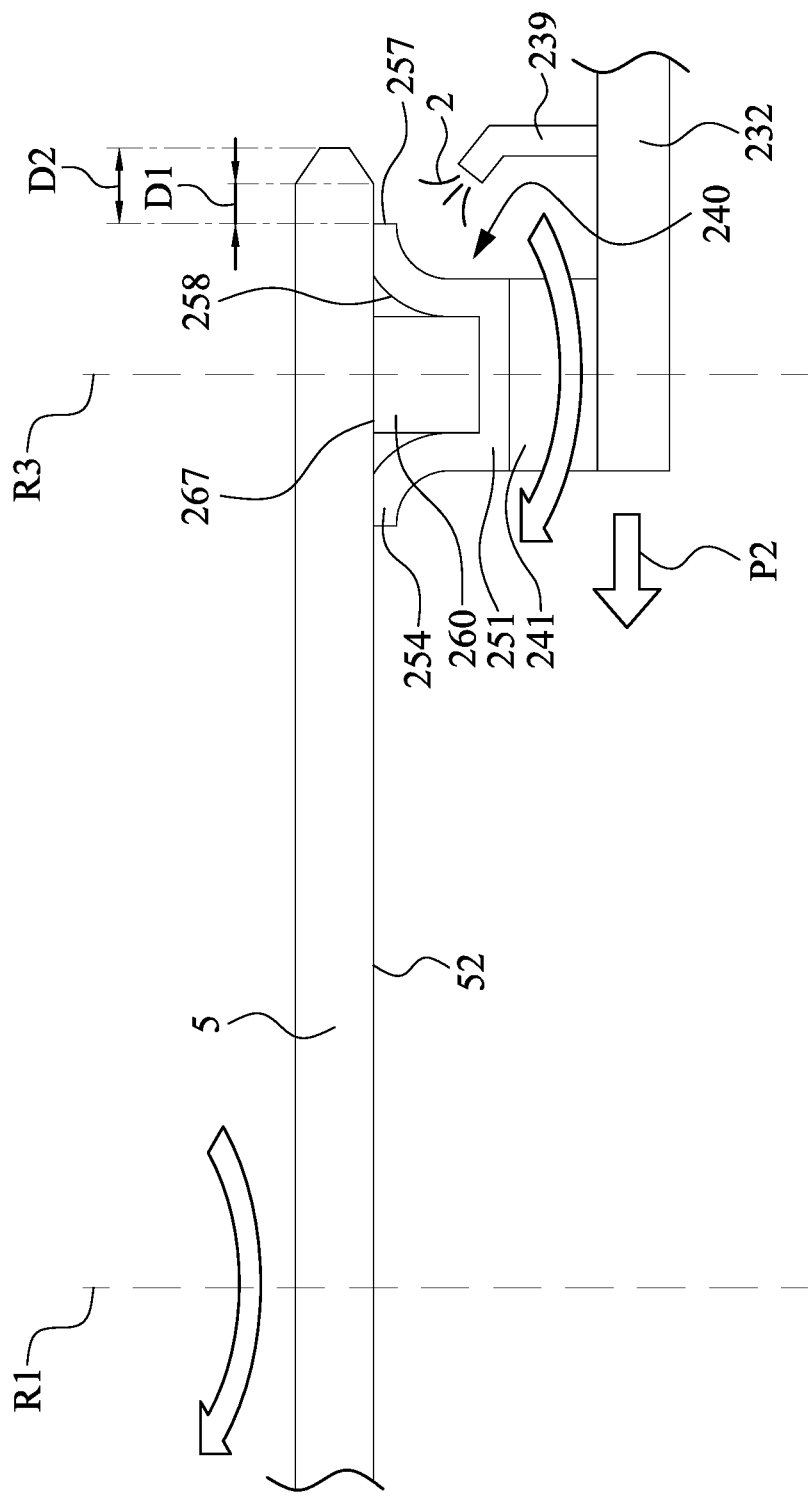
FIG. 10H is a schematic view of one stage of a method for a backside polishing process according to some embodiments of the present disclosure, wherein a first brush member is moved to a second position relative to a semiconductor wafer.

In some embodiments, as shown in FIG. 10H, when the first brush assembly 240 is moved to the second position, the first brush assembly 240 is not cross an apex 53 of the semiconductor wafer 5 and not across a bottom bevel edge 54 of the semiconductor wafer 5. Specifically, the upper end surface 257 of the outer brush member 250 is distant from a bevel edge 54 by a first distance D1 and is distant from the apex 53 by a second distance D2. In one exemplary embodiment, the second distance D2 less than 2.5 mm, and the first distance D1 is less than about 1 mm and greater than 0 mm. As such, area of the peripheral region of the semiconductor wafer 5 being cleaned by the first brush assembly 240 is maximized, and an interference between the first brush assembly 240 and pins of the wafer stage 210 for holding the semiconductor wafer 5 is avoided.

In some embodiments, the first brush assembly 240 is moved from the edge of the semiconductor wafer 5 (i.e., second position) along a traveling path P2 back to the center of the semiconductor wafer 5 (i.e., first position). The traveling path P2 is parallel to the back surface 52 of the semiconductor wafer 5. As a result, during the inwardly horizontal movement of the first brush assembly 240, the first brush assembly 240 applies the same compression force (e.g., 9N) on the backside surface 52 of the semiconductor wafer 5.

Figure 10I:
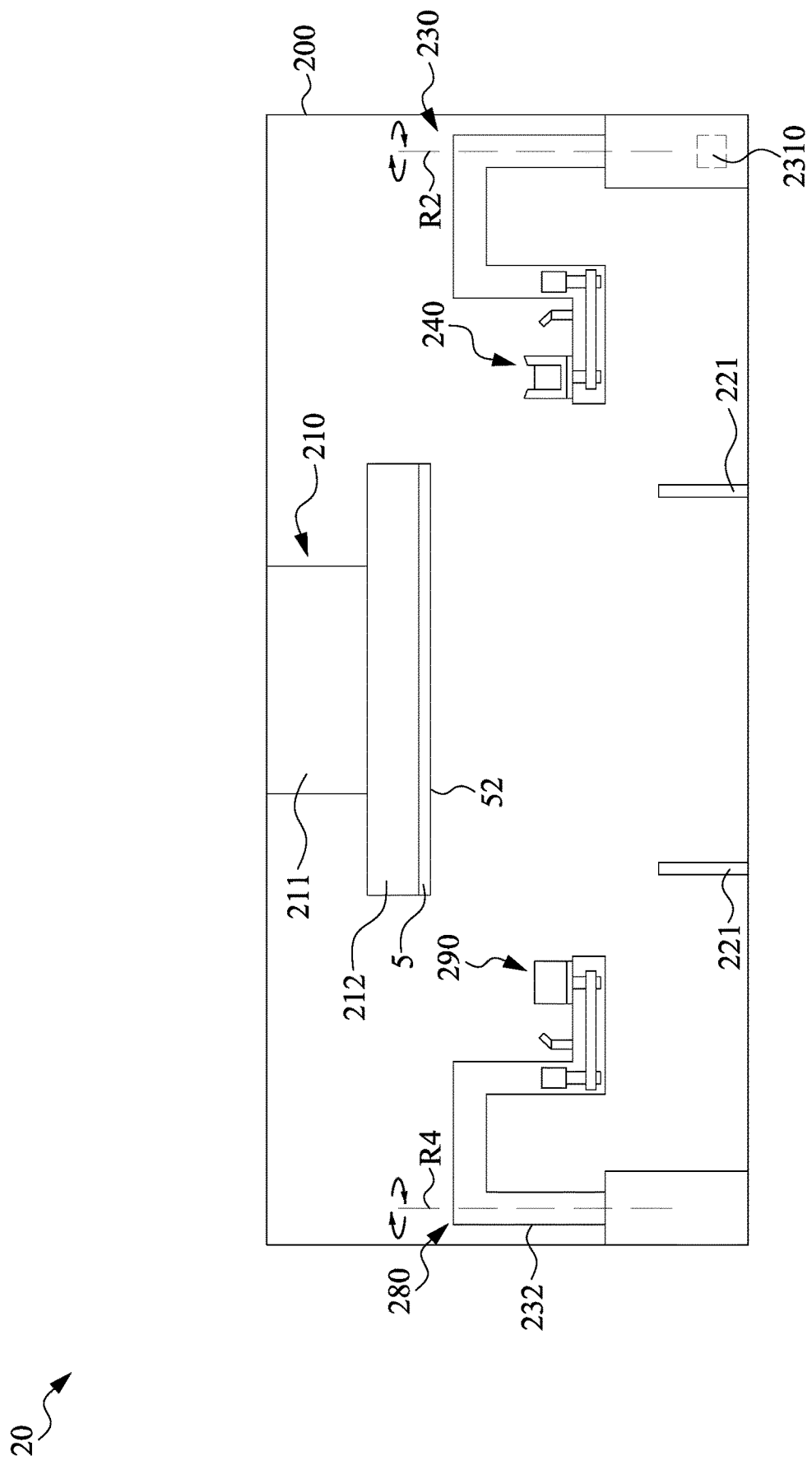
FIG. 10I is a schematic view of one stage of a method for a backside polishing process according to some embodiments of the present disclosure, wherein a first brush assembly is moved back to a stand-by position.

The first polishing stage also includes operation S145, in which the first brush assembly 240 is moved away from the backside surface 52. In some embodiments, the first brush assembly 240 is moved back and forth along the traveling path P1 and the traveling path P2 for a first predetermined time period so as to clean entire area of the backside surface 52 of the semiconductor wafer 5. After the first predetermined time, the rotation of the first brush assembly 240 is stopped, and the supply of processing liquid is terminated. In addition, the first brush assembly 240 is lowered and moved to a stand-by position as shown in FIG. 10I by manipulating the arm 232 of the first manipulating module 230. As such, the first polishing process is finished.

In some embodiments, a prevention maintenance (PM) operation for the first brush assembly 240 is performed after the first brush assembly 240 is moved back to the stand-by position. The PM operation at least includes replacing at least one of the inner brush member 260 and the outer brush member 250. Since the inner brush member 260 and the outer brush member 250 are detachable from the base plate 241, the time needed for the prevention maintenance operation is reduced, and a decrease in productivity resulting from too long a wait time for the backside polishing apparatus 20 to become available can be avoided.

Figure 10J:
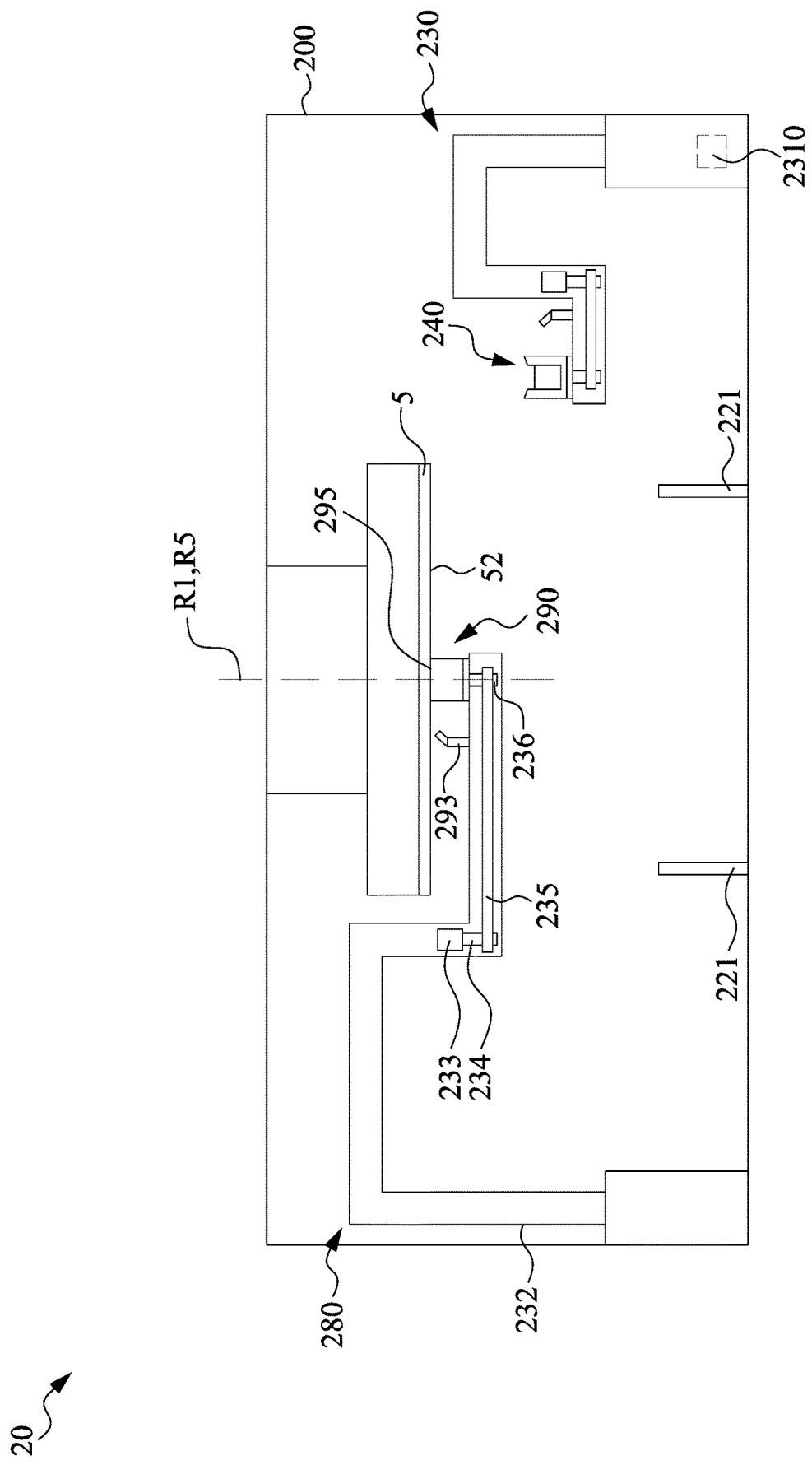
FIG. 10J is a schematic view of one stage of a method for a backside polishing process according to some embodiments of the present disclosure, wherein a second brush assembly is used to polish a semiconductor wafer.

In some embodiments, the backside polishing process also includes operation S150 to perform a second polishing stage. In some embodiments, the second polishing stage includes operation S151 in which the second brush assembly 290 is moved toward the backside surface 52 of the semiconductor wafer 5. In some embodiments, as shown in FIG. 10I, the second brush assembly 290 is moved to a position below the semiconductor wafer 5 by rotating the arm 232 of the second manipulating module 280 about the rotation axis R4. In addition, the second brush assembly 290 is moved toward the semiconductor wafer 5 by lifting the arm 232 of the second manipulating module 280 until the second brush assembly 290 is in contact with the backside surface 52 of the semiconductor wafer 5, as shown in FIG. 10J.

The second polishing stage also includes operation S152, in which the second brush assembly is rotated relative to the semiconductor wafer for a second predetermined time. In some embodiments, after the second brush assembly 290 is in contact with the backside surface 52 of the semiconductor wafer 5, the second brush assembly 290 is rotated about the rotation axis R5 in a speed of about 300 rpm to about 500 rpm to polish the backside surface 52 of the semiconductor wafer 5. In the same time, the semiconductor wafer 5 is rotated by the wafer stage 210 about the rotation axis R1 in a speed of about 2000 rpm. In some embodiments, the rotation direction of the second brush assembly 290 and the rotation direction of the semiconductor wafer 5 are same. Alternatively, the rotation direction of the second brush assembly 290 is opposite to the rotation direction of the semiconductor wafer 5.

In some embodiments, during the operation S152 is performed, operations S142 and operation S144 for the first polishing process can be applied to the second polishing stage, and details of the second polishing process is not repeated for brevity.

Figure 10K:
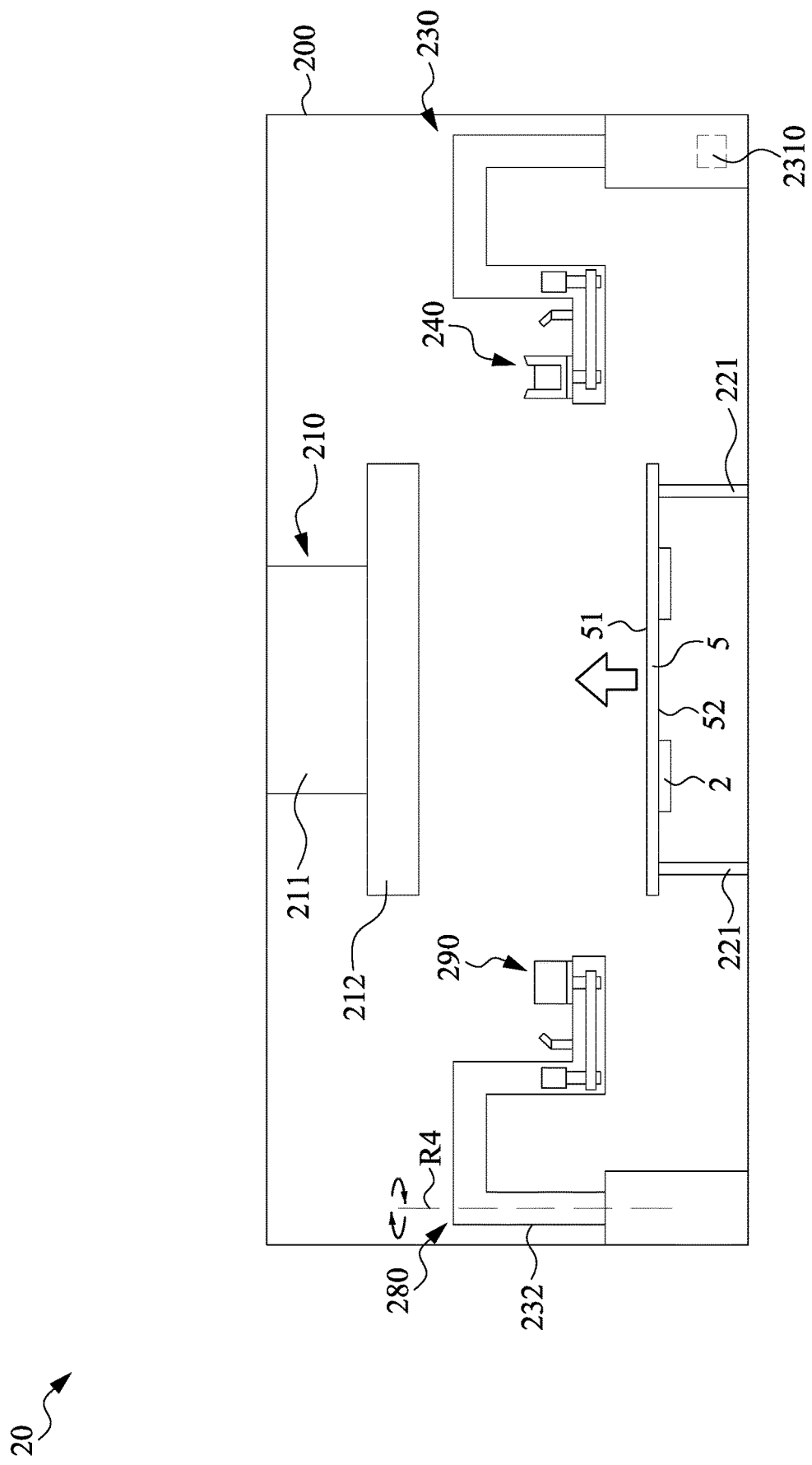
FIG. 10K is a schematic view of one stage of a method for a backside polishing process according to some embodiments of the present disclosure, wherein a second brush assembly is moved back to a stand-by position.

In some embodiments, the second polishing stage also includes operation S153, in which the second brush assembly 290 is moved away from the backside surface 52. In some embodiments, the rotation of the second brush assembly 290 is performed for a second predetermined time period so as to cleaning entire area of the backside surface 52 of the semiconductor wafer 5. After the second predetermined time, the rotation of the second brush assembly 290 is stopped, and the supply of processing liquid is terminated. In addition, the second brush assembly 290 is lowered and moved to a stand-by position as shown in FIG. 10K by manipulating the arm 232 of the second manipulating module 280. As such, the second polishing process is finished.

In some embodiments, the backside polishing process also includes operation S132, in which the semiconductor wafer 5 is unloaded from the wafer stage 210. In some embodiments, as shown in FIG. 10K, the semiconductor wafer 5 unloaded from the wafer stage 210 is supported by the support and removed from the chamber 200 through the robot arm 2. With the removal of the polished semiconductor wafer 5, another contaminated semiconductor wafer 5 can be sent into the chamber 200 for the backside polishing process.

Referring FIG. 8, the wafer processing method S100 also includes operation S160, in which a lithographic exposure is performed in the exposure module 30 (FIG. 2). Exposure of the photoresist material may be performed, for example, using an immersion lithography tool or an extreme ultra-violet light (EUV) tool to increase resolution and decrease the minimum achievable pitch. The wafer processing method S100 also includes operation S165, in which a post exposure bake (PEB) operation is performed to harden the exposed photoresist material.

Figure 13:
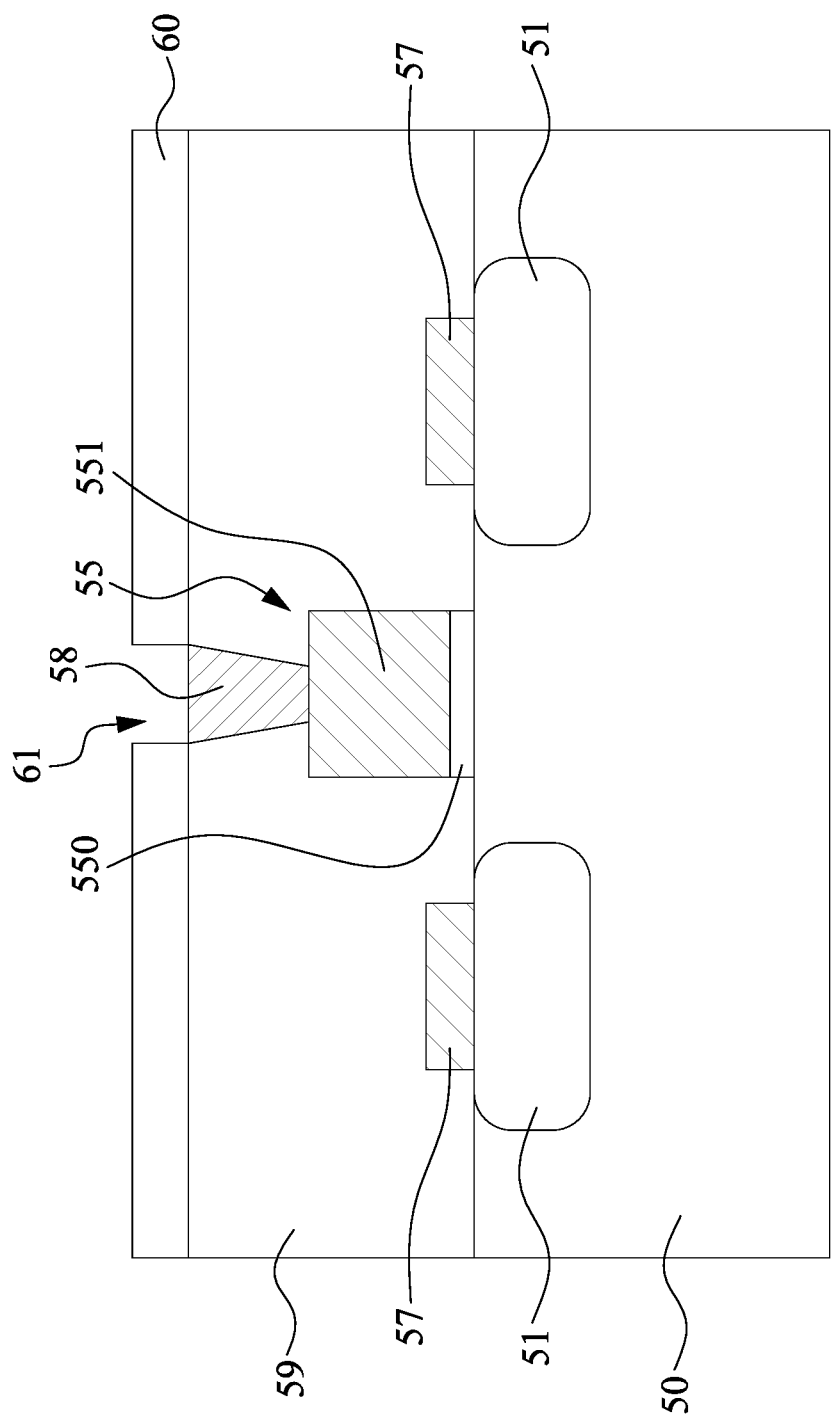
FIG. 13 is a schematic view of a method of forming a contact in a patterned photoresist layer, in accordance with some embodiments of the present disclosure.

The wafer processing method S100 also includes operation S170, in which a developing process is performed. In some embodiments, as shown in FIG. 13, the photoresist material of the photoresist layer 60 is developed to form an opening 61. For a positive tone photoresist material, the exposed regions are developed by applying a developer solution and then is removed. For a negative tone photoresist material, the non-exposed regions are developed by applying a developer solution and is subsequently removed. The wafer processing method S100 also includes operation S175, in which a hard bake operation is performed to harden the photoresist 60.

The wafer processing method S100 also includes operation S180, in which a feature is formed. In some embodiments, before the formation of the feature 58, the exposed dielectric layer 59 is etched to form an opening that exposes a portion of the feature 55. Afterwards, as shown in FIG. 13, a feature 58 is deposited in the opening 61 of the dielectric layer 59 to function as a contact of the feature 55. Since the contamination on the backside surface 52 of the semiconductor wafer 5 is removed in the previously conducted backside polishing process, an overlay shift between the feature 58 and the underlying feature 55 is minimized. In comparison with a backside polishing process using a RN brush only, a better overlay (i.e., an overlay shift is improved from 1.69 to 1.37 in X-direction and is improved from 1.64 to 1.16) performance is exhibited on the semiconductor wafer 5 undergoing the wafer processing method S100.

Embodiments of the disclosure provide a hybrid type brush assembly having composite materials to clean or polish backside surface of semiconductor wafers. With the use of the hybrid type brush assembly, tough contaminations accumulated on the backside surface of semiconductor wafers are efficiently removed and less haze are found on the backside surfaces of semiconductor wafers. Therefore, a product yield of the semiconductor wafers is improved.

In accordance with some embodiments, a wafer processing method is provided. The wafer processing method includes placing a semiconductor wafer on a wafer stage with a backside surface of the semiconductor wafer facing downwardly. The wafer processing method further includes positioning a first brush assembly below the backside surface of the semiconductor wafer. The wafer processing method also includes moving a first brush assembly toward the backside surface of the semiconductor wafer to a first position. At the first position, an inner brush member and an outer brush member of the first brush assembly, made of different materials, are in contact with the backside surface of the semiconductor wafer. In addition, the wafer processing method includes rotating the first brush assembly relative to the semiconductor wafer while the first brush assembly is in the first position.

In accordance with some embodiments, a wafer processing method is provided. The wafer processing method includes placing a semiconductor wafer on a wafer stage with a backside surface of the semiconductor wafer facing downwardly. The wafer processing method further includes positioning a first brush assembly below the backside surface of the semiconductor wafer. The wafer processing method also includes moving the first brush assembly toward the backside surface of the semiconductor wafer to a first position. At the first position, an inner brush member is in contact with the backside surface and an outer brush member which surrounds the inner brush member is compressed and bent outwardly. In addition, the wafer processing method includes rotating the first brush assembly relative to the semiconductor wafer while the first brush assembly is in the first position.

In accordance with some embodiments, a semiconductor fabricating system includes a wafer stage and a brush assembly moveable located below the wafer stage. The brush assembly includes a base plate, an inner brush member and an outer brush member. The inner brush member positioned on the base plate, and the outer brush member surrounds the inner brush member. The semiconductor fabricating system also includes a shaft and an actuator. The shaft is connected to the base plate, and the actuator is connected to shaft. The semiconductor fabricating system further include a controller programmed to send electric signals to the actuator to drive the base plate to rotate around a rotation axis.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer processing method, comprising:
    placing a semiconductor wafer on a wafer stage with a backside surface of the semiconductor wafer facing downwardly;
    positioning a first brush assembly below the backside surface of the semiconductor wafer, wherein the first brush assembly comprises an inner brush member and an outer brush member surrounding the inner brush member, wherein the inner brush member is made of a different type of material than the outer brush member, wherein the outer brush member comprises an upper end surface, wherein the outer brush member comprises an inner surface facing the inner brush member, and wherein the outer brush member comprises a beveled surface extending from a top edge of the inner surface of the outer brush member to an inner edge of the upper end surface of the outer brush member, and wherein the beveled surface is non-perpendicular to the upper end surface of the outer brush member;
    moving the first brush assembly toward the backside surface of the semiconductor wafer to a first position at which the inner brush member and the outer brushy member of the first brush assembly are in contact with the backside surface of the semiconductor wafer; and
    rotating the first brush assembly relative to the semiconductor wafer while the first brush assembly is in the first position.

2. The wafer processing method as claimed in claim 1, further comprising supplying a processing liquid over the first brush assembly and guiding the processing liquid passing through an outer groove formed on the outer brush member.

3. The wafer processing method as claimed in claim 2, further comprising guiding the processing liquid from an inner groove formed on the inner brush member to the outer groove.

4. The wafer processing method as claimed in claim 2, wherein during the supplying of the processing liquid, the processing liquid is absorbed by the inner brush member and results in an increase in a volume of the inner brush member and makes an outer side wall of the inner brush member come in contact with an inner side wall of the outer brush member.

5. The wafer processing method as claimed in claim 1, wherein before the movement of the first brush assembly toward the backside surface of the semiconductor wafer, the outer brush member is distant from the backside surface of the semiconductor wafer by a first distance and the inner brush member is distant from the backside surface of the semiconductor wafer by a second distance which is greater than the first distance.

6. The wafer processing method as claimed in claim 5, wherein moving the first brush assembly toward the backside surface of the semiconductor wafer comprises moving the first brush assembly the second distance toward the backside surface of the semiconductor wafer to cause the outer brush member to bend outwardly.

7. The wafer processing method as claimed in claim 1, further comprising:
   moving the first brush assembly away from the backside surface of the semiconductor wafer after the rotation of the first brush assembly is performed for a first predetermined time period;
   moving a second brush assembly toward the backside surface to enable a brush member having a cylinder shape to be in contact with the backside surface of the semiconductor wafer; and
   rotating the second brush assembly relative to the semiconductor wafer after the movement of the second brush assembly toward the backside surface of the semiconductor wafer.

8. The wafer processing method as claimed in claim 1, further comprising reciprocally moving the first brush assembly back and forth from the first position to a second position along a traveling path that is parallel to the backside surface of the semiconductor wafer, wherein in the second position, a lower end of the outer brush member is in contact with the backside surface of the semiconductor wafer and spaced apart from an edge of the semiconductor wafer.

9. A wafer processing method, comprising:
   placing a semiconductor wafer on a wafer stage with a backside surface of the semiconductor wafer facing downwardly;
   positioning a first brush assembly below the backside surface of the semiconductor wafer, wherein the first brush assembly comprises a base plate, an inner brush member, and an outer brush member, wherein the outer brush member comprises a bottom portion and a peripheral portion extending away from the bottom portion, wherein the base plate contacts the bottom portion of the outer brush member, wherein an upper surface of the bottom portion of the outer brush member contacts a first surface of the inner brush member, wherein the first surface of the inner brush member is located above the upper surface of the bottom portion of the outer brush member, and wherein the peripheral portion of the outer brush member surrounds the inner brush member;
   moving the first brush assembly toward the backside surface of the semiconductor wafer to a first position at which the inner brush member is in contact with the backside surface and the outer brush member is compressed and bent outwardly; and
   rotating the first brush assembly relative to the semiconductor wafer while the first brush assembly is in the first portion.

10. The wafer processing method as claimed in claim 9, further comprising supplying a processing liquid over the first brush assembly, wherein the processing liquid passes through an outer groove formed on the outer brush member.

11. The wafer processing method as claimed in claim 10, further comprising guiding the processing liquid from an inner groove formed on the inner brush member to the outer groove.

12. The wafer processing method as claimed in claim 10, wherein during the supplying of the processing liquid, the processing liquid is absorbed by the inner brush member and results in an increase in a volume of the inner brush member and makes an outer side wall of the inner brush member come in contact with an inner side wall of the outer brush member.

13. The wafer processing method as claimed in claim 9, wherein before the movement of the first brush assembly toward the backside surface of the semiconductor wafer, the outer brush member is distant from the backside surface of the semiconductor wafer by a first distance and the inner brush member is distant from the backside surface of the semiconductor wafer by a second distance which is greater than the first distance.

14. The wafer processing method as claimed in claim 13, wherein moving the first brush assembly toward the backside surface of the semiconductor wafer comprises moving the first brush assembly the second distance toward the backside surface of the semiconductor wafer to cause the outer brush member to bend outwardly.

15. The wafer processing method as claimed in claim 9, further comprising:
   moving the first brush assembly away from the backside surface of the semiconductor wafer after the rotation of the first brush assembly is performed for a first predetermined time period;
   moving a second brush assembly toward the backside surface to enable a brush member having a cylinder shape to be in contact with the backside surface of the semiconductor wafer; and
   rotating the second brush assembly relative to the semiconductor wafer after the movement of the second brush assembly toward the backside surface of the semiconductor wafer.

16. The wafer processing method as claimed in claim 9, further comprising reciprocally moving the first brush assembly back and forth from the first position to a second position along a traveling path that is parallel to the backside surface of the semiconductor wafer, wherein in the second position, a lower end of the outer brush member is in contact with the backside surface of the semiconductor wafer and spaced apart from an edge of the semiconductor wafer.

17. A wafer processing method, comprising:
   placing a semiconductor wafer on a wafer stage with a backside surface of the semiconductor wafer facing downwardly;
   positioning a brush assembly below the backside surface of the semiconductor wafer, wherein an outer brush member of the brush assembly is distant from the backside surface of the semiconductor wafer by a first distance while an inner brush member of the brush assembly is distant from the backside surface of the semiconductor wafer by a second distance which is greater than the first distance, wherein the outer brush member surrounds the inner brush member of the brush assembly, wherein the outer brush member has a bottom portion and a peripheral portion extending away from the bottom portion and terminating in an upper end surface, and wherein the peripheral portion of the outer brush member has an outer groove recessed from the upper end surface of the peripheral portion of the outer brush member;
   moving the brush assembly toward the backside surface of the semiconductor wafer by the second distance such that both the outer brush member and the inner brush member contact the backside surface of the semiconductor wafer; and rotating the brush assembly relative to the semiconductor wafer.

18. The wafer processing method as claimed in claim 17, further comprising rotating the semiconductor wafer, and wherein a rotation direction of the rotating of the brush assembly is the same as a rotation direction of the rotating of the semiconductor wafer.

19. The wafer processing method as claimed in claim 17, wherein the outer brush member is made of a material which has a lower structural strength than a material of the inner brush member.

20. The wafer processing method as claimed in claim 17, further comprising moving the brush assembly from a center of the semiconductor wafer toward an edge of the semiconductor wafer after moving the brush assembly toward the backside surface of the semiconductor wafer.

* * * * *